United States Patent
Rhee

(10) Patent No.: US 9,425,173 B2
(45) Date of Patent: Aug. 23, 2016

(54) DISPLAY DEVICE USING SEMICONDUCTOR LIGHT EMITTING DEVICE

(71) Applicant: LG Electronics Inc., Seoul (KR)

(72) Inventor: Byungjoon Rhee, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 14/463,417

(22) Filed: Aug. 19, 2014

(65) Prior Publication Data

US 2015/0054008 A1 Feb. 26, 2015

(30) Foreign Application Priority Data

Aug. 20, 2013 (KR) .................. 10-2013-0098313

(51) Int. Cl.
| | |
|---|---|
| *H01L 27/15* | (2006.01) |
| *H01L 25/075* | (2006.01) |
| *H01L 33/00* | (2010.01) |
| *H01L 33/46* | (2010.01) |

(52) U.S. Cl.
CPC ........... *H01L 25/0753* (2013.01); *H01L 27/156* (2013.01); *H01L 33/0079* (2013.01); *H01L 33/46* (2013.01); *H01L 2224/14* (2013.01)

(58) Field of Classification Search
CPC ............ H01L 27/3244; H01L 51/5237; H01L 2251/5315; H01L 51/56; H01L 2924/00; H01L 27/156; H01L 27/3211; H01L 27/3246; H01L 51/5203; H01L 2224/73267; H01L 33/08; H01L 33/24; H01L 33/30; H01L 27/15
USPC .................................. 257/89, 88, 98, 432, 40
See application file for complete search history.

(56) References Cited

U.S. PATENT DOCUMENTS

| | | | | |
|---|---|---|---|---|
| 2002/0096994 | A1* | 7/2002 | Iwafuchi | ............. H01L 21/2007 313/495 |
| 2007/0090387 | A1* | 4/2007 | Daniels | ................... H01L 24/75 257/99 |
| 2010/0267179 | A1 | 10/2010 | Miyairi et al. | |
| 2013/0092310 | A1 | 4/2013 | Ishigami et al. | |

FOREIGN PATENT DOCUMENTS

| | | |
|---|---|---|
| JP | 2012-084582 A | 4/2012 |
| JP | 2012-186322 A | 9/2012 |
| KR | 10-2010-0038937 A | 4/2010 |
| KR | 10-2012-0038539 A | 4/2012 |
| KR | 10-2014-0101602 A | 8/2014 |

\* cited by examiner

*Primary Examiner* — Chuong A Luu
*Assistant Examiner* — Rodolfo Fortich
(74) *Attorney, Agent, or Firm* — Birch, Stewart, Kolasch & Birch, LLP

(57) ABSTRACT

A display device according to an embodiment of the present disclosure may include a lower substrate disposed with a line electrode at an upper portion thereof, a plurality of semiconductor light emitting devices electrically connected to the line electrode to generate light and disposed to be separated from one another, and an adhesive portion including a body configured to fix the location of the lower substrate to that of the semiconductor light emitting device, and a conductor dispersed within the body to electrically connect the lower substrate to the semiconductor light emitting device, wherein the plurality of semiconductor light emitting devices form one pixel region (P) having red, green and blue semiconductor light emitting devices that emit red, green and blue light, and contain a material selected from inorganic semiconductor materials, and the adhesive portion blocks light generated from the plurality of semiconductor light emitting devices.

19 Claims, 13 Drawing Sheets

(a)

(b)

(c)

(a)

(b)

(c)

DISPLAY DEVICE USING SEMICONDUCTOR LIGHT EMITTING DEVICE

CROSS-REFERENCE TO RELATED APPLICATIONS

Pursuant to 35 U.S.C. §119(a), this application claims the benefit of earlier filing date and right of priority to Korean Patent Application No. 10-2013-0098313, filed on Aug. 20, 2013, the contents of which is incorporated by reference herein in its entirety.

BACKGROUND OF THE INVENTION

1. Field of the Invention

The present disclosure relates to a display device, and more particularly, to a display device using a semiconductor light emitting device.

2. Description of the Related Art

In recent years, display devices having excellent characteristics such as low profile, flexibility and the like have been developed in the display technical field. On the contrary, currently commercialized main displays are represented by liquid crystal displays (LCDs) and active matrix organic light emitting diodes (AMOLEDs).

However, there exist problems such as not-so-fast response time, difficult implementation of flexibility in case of LCDs, and there exist drawbacks such as short life span, not-so-good yield as well as low flexibility in case of AMOLEDs.

On the other hand, light emitting diodes (LEDs) are well known light emitting devices for converting an electrical current to light, and have been used as a light source for displaying an image in an electronic device including information communication devices since red LEDs using GaAsP compound semiconductors were made commercially available in 1962, together with a GaP:N-based green LEDs. Accordingly, the semiconductor light emitting devices may be used to implement a flexible display, thereby presenting a scheme for solving the problems.

SUMMARY OF THE INVENTION

An aspect of the present disclosure is to provide a new type of display device with flexibility, which is different from the related art.

Another aspect of the present disclosure is to provide a display device having long life span, low power consumption, high efficiency and fast response time.

A display device according to an embodiment of the present disclosure may include a lower substrate disposed with a line electrode at an upper portion thereof, a plurality of semiconductor light emitting devices electrically connected to the line electrode to generate light and disposed to be separated from one another, and a conductive adhesive layer comprising a body configured to fix the location of the lower substrate to that of the semiconductor light emitting device, and conductors dispersed within the body to electrically connect the lower substrate to the semiconductor light emitting device, wherein the plurality of semiconductor light emitting devices form one pixel region (P) having red, green and blue semiconductor light emitting devices that emit red, green and blue light, and contain a material selected from inorganic semiconductor materials, and the conductive adhesive layer blocks light generated from the plurality of semiconductor light emitting devices.

Here, the semiconductor light emitting device may include a first conductive semiconductor layer, an active layer located on the first conductive semiconductor layer, and a second conductive semiconductor layer located on the active layer.

Furthermore, the first and the second electrode may be in contact with at least part of the conductors.

On the other hand, the body of the conductive adhesive layer may be disposed to surround a lateral surface and a lower surface of the semiconductor light emitting device.

Furthermore, the body of the conductive adhesive layer may contain a material that absorbs light.

Furthermore, the body of the conductive adhesive layer may have mobility and be cured in any one of normal temperature, high temperature and catalyst atmosphere.

On the other hand, the red semiconductor light emitting device may have a composition formula of $(Al_xGa_{1-x})_{0.5}In_{0.5}P$ or GaAsP.

Furthermore, the green semiconductor light emitting device may have a composition formula of GaP.

In addition, the blue semiconductor light emitting device may have a composition formula of $In_xAl_yGa_{1-x-y}N$ ($0 \leq x \leq 1$, $0 \leq y \leq 1$, $0 \leq x+y \leq 1$).

According to the present disclosure having the foregoing configuration, a distance between light emitting devices may be sufficiently large and the conductive adhesive layer may have softness, thereby implementing a rollable display device.

According to an embodiment, an inorganic semiconductor light emitting device may be disposed in a pixel region, thereby having an advantage capable of implementing a high-speed screen with a fast response time.

Furthermore, according to an embodiment, an additional back light may be not required, thereby having an advantage of excellent luminance and excellent efficiency.

Furthermore, the semiconductor light emitting device may be an inorganic material, thereby having an advantage of long life span.

Furthermore, according to an embodiment, the semiconductor light emitting device may be disposed in a pixel unit, thereby having an advantage of being implemented easily with an active type.

Furthermore, the first and the second electrode may be located at a lower region of the active layer generating light, thereby preventing light from being absorbed to the first and the second electrode.

Furthermore, the adhesive portion may block light generated from the semiconductor light emitting device, thereby suppressing optical interference between the pixel region and sub-pixel region.

Furthermore, a color filter for implementing color may be omitted, thereby advantage capable of fabricating a low-profile display device.

DETAILED DESCRIPTION OF THE INVENTION

Figure 1:
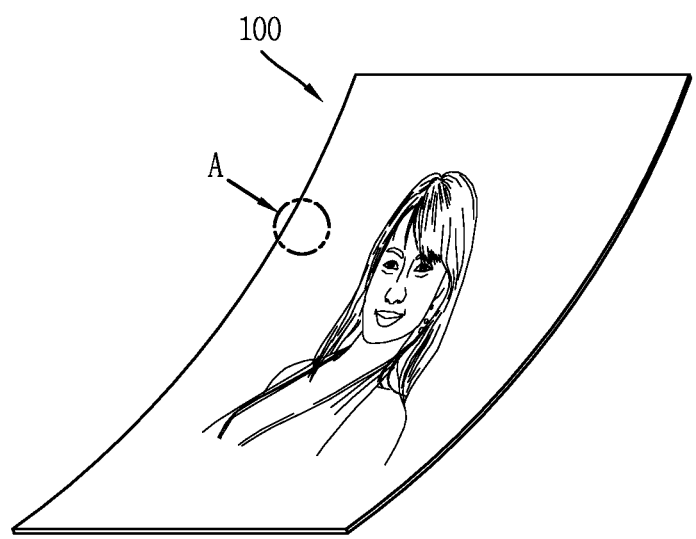
FIG. 1 is a conceptual view illustrating a display device using a semiconductor light emitting device according to an embodiment of the present disclosure.

Advantages and features of the present disclosure, and methods of accomplishing the same will be clearly understood with reference to the following embodiments described in detail in conjunction with the accompanying drawings. However, the present disclosure is not limited to those embodiments disclosed below but may be implemented in various different forms. It should be noted that the present embodiments are merely provided to make a full disclosure of the invention and also to allow those skilled in the art to know the full range of the invention, and therefore, the present invention is to be defined only by the scope of the appended claims. Further, like reference numerals refer to like or similar elements throughout the specification.

Spatially relative terms such as "below", "beneath", "lower", "above", or "upper" may be used herein to describe a correlation between one device or constituent element and other devices or constituent elements as illustrated in the drawings. It will be understood that spatially relative terms are intended to include a different direction of device during the use or operation in addition to its direction illustrated in the drawings. For example, when a device in the drawing is turned over, the device described as "below" or "beneath" another device will be placed "above" the another device. Accordingly, the exemplary terms "below" or "beneath" may include both directions of above and below. Since the device may be oriented in another direction, and thus the spatially relative terms may be interpreted in accordance with the orientation thereof.

It should be noted that the terms used herein are merely used to describe the embodiments, but not to limit the present invention. In the present specification, unless clearly used otherwise, expressions in a singular form include a plural form. The term "comprises" and/or "comprising" used in the specification intend to express a constituent element, a step, an operation and/or a device does not exclude the existence or addition of one or more other constituent elements, steps, operations and/or devices.

In the drawings, the thickness or size of each layer is exaggerated, omitted, or schematically illustrated for the convenience and clarity of the description. Furthermore, the size or area of each constituent element does not definitely reflect the actual size or area thereof.

Furthermore, angles or directions used to describe the structure of a display device according to an embodiment are based on those shown in the drawings. Unless a reference point or positional relation with respect to an angle is not clearly defined in describing a structure for implementing the display device in the specification, the associated drawings may be referred to.

Hereinafter, embodiments will be described in more detail with reference to the accompanying drawings.

Hereinafter, the embodiments disclosed herein will be described in detail with reference to the accompanying drawings, and the same or similar elements are designated with the same numeral references regardless of the numerals in the drawings and their redundant description will be omitted. A suffix "module" or "unit" used for constituent elements disclosed in the following description is merely intended for easy description of the specification, and the suffix itself does not give any special meaning or function. In describing the embodiments disclosed herein, moreover, the detailed description will be omitted when a specific description for publicly known technologies to which the invention pertains is judged to obscure the gist of the present invention. Also, it should be noted that the accompanying drawings are merely illustrated to easily explain the concept of the invention, and therefore, they should not be construed to limit the technological concept disclosed herein by the accompanying drawings.

Furthermore, it will be understood that when an element such as a layer, region or substrate is referred to as being "on" another element, it can be directly on the another element or an intermediate element may also be interposed therebetween.

A display device disclosed herein may include a portable phone, a smart phone, a laptop computer, a digital broadcast terminal, a personal digital assistant (PDA), a portable multimedia player (PMP), a navigation, a slate PC, a tablet PC, an ultrabook, a digital TV, a desktop computer, and the like. However, it would be easily understood by those skilled in the art that a configuration disclosed herein may be applicable to any displayable device even though it is a new product type which will be developed later.

FIG. 1 is a conceptual view illustrating a display device using a semiconductor light emitting device according to an embodiment of the present disclosure.

According to the drawing, information processed in the controller of the display device 100 may be displayed using a flexible display.

The flexible display may include a flexible, bendable, twistable, foldable and rollable display. For example, the flexible display may be a display fabricated on a thin and flexible substrate that can be warped, bent, folded or rolled like a paper sheet while maintaining the display characteristics of a flat display in the related art.

A display area of the flexible display becomes a plane in a configuration that the flexible display is not warped (for example, a configuration having an infinite radius of curvature, hereinafter, referred to as a "first configuration"). The display area thereof becomes a curved surface in a configuration that the flexible display is warped by an external force in the first configuration (for example, a configuration having a finite radius of curvature, hereinafter, referred to as a "second configuration"). As illustrated in the drawing, information displayed in the second configuration may be visual information displayed on a curved surface. The visual information may be implemented by individually controlling the light emission of sub-pixels disposed in a matrix form. The sub-pixel denotes a minimum unit for implementing one color.

The sub-pixel of the flexible display may be implemented by a semiconductor light emitting device. According to the present disclosure, a light emitting diode (LED) is illustrated as a type of semiconductor light emitting device. The light emitting diode may be formed with a small size to perform the role of a sub-pixel even in the second configuration through this.

Hereinafter, a flexible display implemented using the light emitting diode will be described in more detail with reference to the accompanying drawings.

Figure 2:
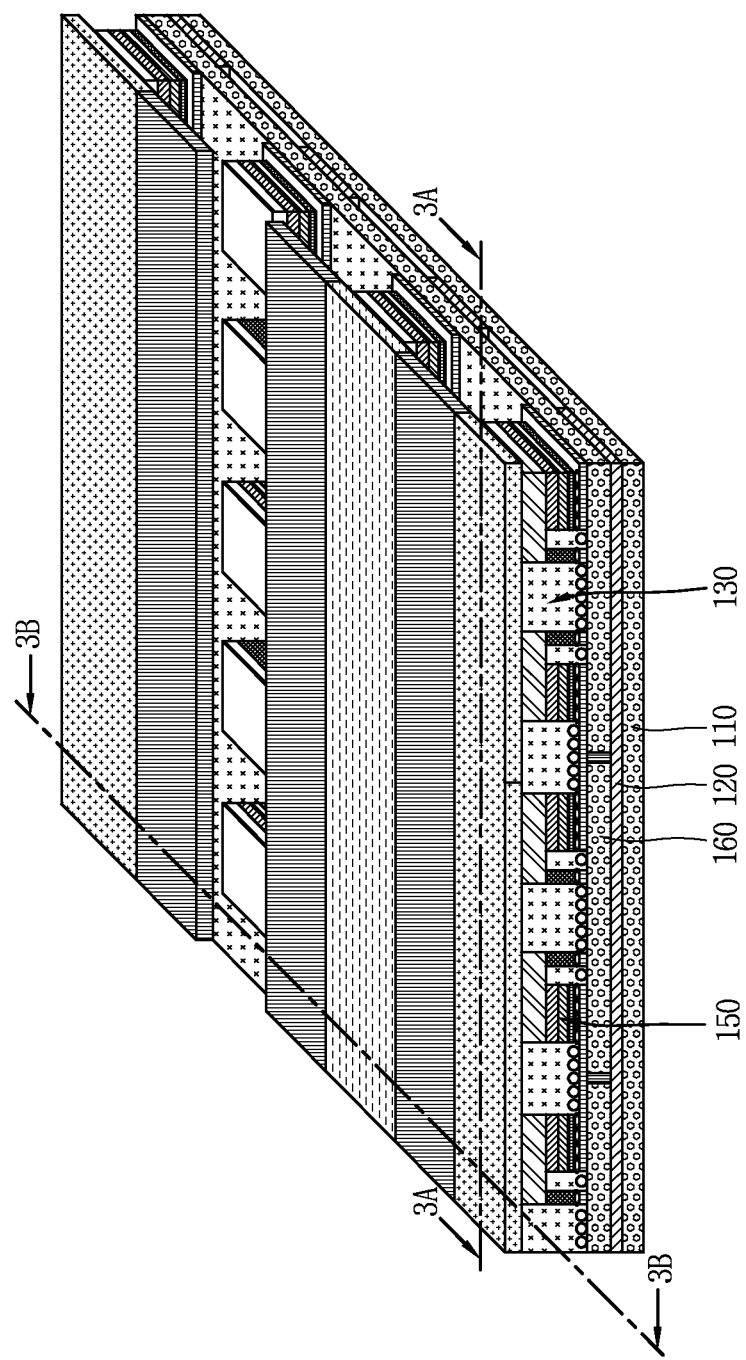
FIG. 2 is a partial enlarged view of portion "A" in FIG. 1.
Figure 3A:
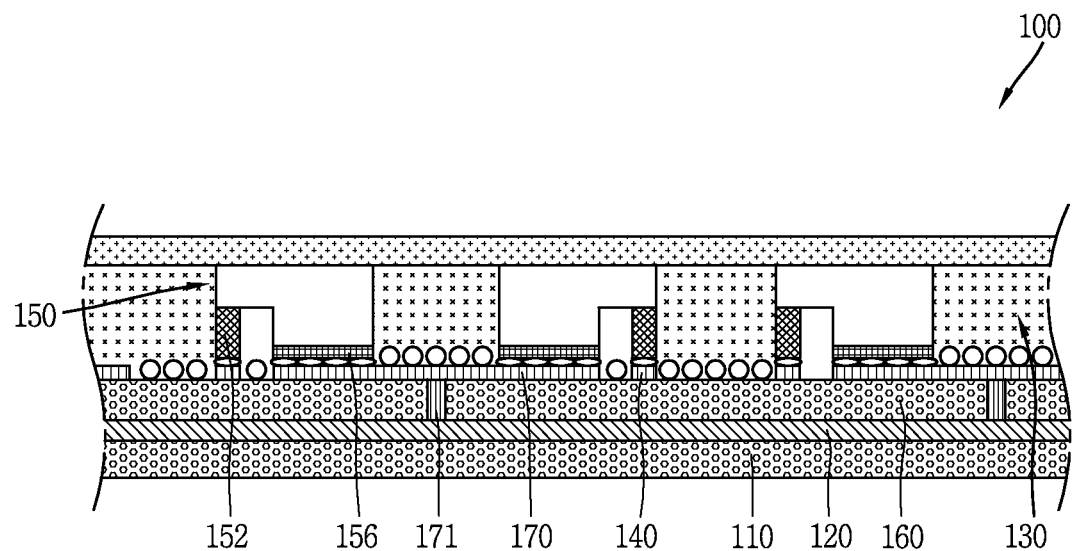
FIGS. 3A and 3B are cross-sectional views taken along lines 3A-3A and 3B-3B in FIG. 2.
Figure 3B:
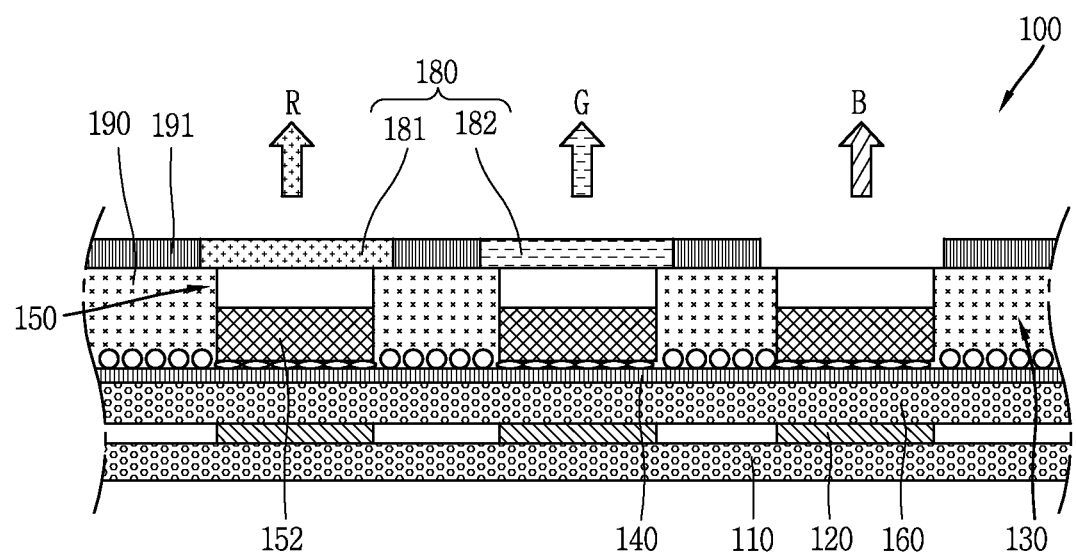
Figure 4:
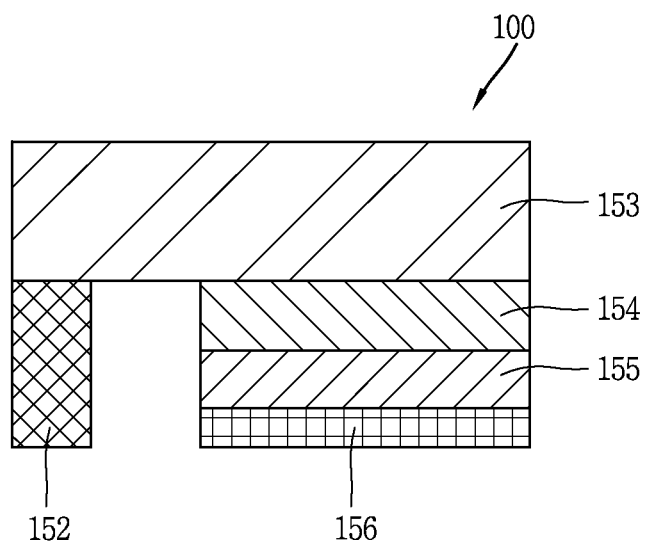
FIG. 4 is a conceptual view illustrating a flip-chip type semiconductor light emitting device in FIG. 3A.

FIG. 2 is a partial enlarged view of portion "A" in FIG. 1, and FIGS. 3A and 3B are cross-sectional views taken along lines 3A-3A and 3B-3B in FIG. 2, FIG. 4 is a conceptual view illustrating a flip-chip type semiconductor light emitting device in FIG. 3A, and FIGS. 5A through 5C are conceptual views illustrating various forms for implementing colors in connection with a flip-chip type semiconductor light emitting device.

According to the drawings in FIGS. 2, 3A and 3B, there is illustrated a display device 100 using a passive matrix (PM) type semiconductor light emitting device as a display device 100 using a semiconductor light emitting device. However, the following illustration may be also applicable to an active matrix (AM) type semiconductor light emitting device.

The display device 100 may include a substrate 110, a first electrode 120, a conductive adhesive layer 130, a second electrode 140, and a plurality of semiconductor light emitting devices 150.

The substrate 110 may be a flexible substrate. The substrate 110 may contain glass or polyimide (PI) to implement the flexible display device. In addition, if it is a flexible material, any one such as polyethylene naphthalate (PEN), polyethylene terephthalate (PET) or the like may be used. Furthermore, the substrate 110 may be either one of transparent and non-transparent materials.

The substrate 110 may be a wiring substrate disposed with the first electrode 120, and thus the first electrode 120 may be placed on the substrate 110.

According to the drawing, an insulating layer 160 may be disposed on the substrate 110 placed with the first electrode 120, and an auxiliary electrode 170 may be placed on the insulating layer 160. In this case, a configuration in which the insulating layer 160 is deposited on the substrate 110 may be single wiring substrate. More specifically, the insulating layer 160 may be incorporated into the substrate 110 with an insulating and flexible material such as polyimide (PI), PET, PEN or the like to form single wiring substrate.

The auxiliary electrode 170 as an electrode for electrically connecting the first electrode 120 to the semiconductor light emitting device 150 is placed on the insulating layer 160, and disposed to correspond to the location of the first electrode 120. For example, the auxiliary electrode 170 has a dot shape, and may be electrically connected to the first electrode 120 by means of an electrode hole 171 passing through the insulating layer 160. The electrode hole 171 may be formed by filling a conductive material in a via hole.

Referring to the drawings, the conductive adhesive layer 130 may be formed on one surface of the insulating layer 160, but the present disclosure may not be necessarily limited to this. For example, it may be possible to also have a structure in which the conductive adhesive layer 130 is disposed on the substrate 110 with no insulating layer 160. The conductive adhesive layer 130 may perform the role of an insulating layer in the structure in which the conductive adhesive layer 130 is disposed on the substrate 110.

The conductive adhesive layer 130 may be a layer having adhesiveness and conductivity, and to this end, a conductive material and an adhesive material may be mixed on the conductive adhesive layer 130. Furthermore, the conductive adhesive layer 130 may have flexibility, thereby allowing a flexible function in the display device.

For such an example, the conductive adhesive layer 130 may be an anisotropic conductive film (ACF), an anisotropic conductive paste, a solution containing conductive particles, and the like. The conductive adhesive layer 130 may allow electrical interconnection in the z-direction passing through the thickness thereof, but may be configured as a layer having electrical insulation in the horizontal x-y direction thereof. Accordingly, the conductive adhesive layer 130 may be referred to as a z-axis conductive layer (however, hereinafter referred to as a "conductive adhesive layer").

The anisotropic conductive film is a film with a form in which an anisotropic conductive medium is mixed with an insulating base member, and thus when heat and pressure are applied thereto, only a specific portion thereof may have conductivity by means of the anisotropic conductive medium. Hereinafter, heat and pressure are applied to the anisotropic conductive film, but other methods may be also available for the anisotropic conductive film to partially have conductivity. The methods may include applying only either one of heat and pressure thereto, UV curing, and the like.

Furthermore, the anisotropic conductive medium may be conductive balls or particles. According to the drawing, in the present embodiment, the anisotropic conductive film is a film with a form in which an anisotropic conductive medium is mixed with an insulating base member, and thus when heat and pressure are applied thereto, only a specific portion thereof may have conductivity by means of the conductive balls. The anisotropic conductive film may be in a state in which a core with a conductive material contains a plurality of particles coated by an insulating layer with a polymer material, and in this case, it may have conductivity by means of the core while breaking an insulating layer on a portion to which heat and pressure are applied. Here, the shape of a core may be modified to implement a layer being brought into contact with each other in the thickness direction of the film. For a more specific example, heat and pressure are applied to an anisotropic conductive film as a whole, and electrical connection in the z-axis direction is partially formed by a height difference from a mating object adhered by the use of the anisotropic conductive film.

For another example, an anisotropic conductive film may be in a state containing a plurality of particles in which a conductive material is coated on insulating cores. In this case, a portion to which heat and pressure are applied may be converted (pressed and adhered) to a conductive material to have conductivity in the thickness direction of the film. For still another example, it may be formed to have conductivity in the thickness direction of the film in which a conductive material passes through an insulating base member in the z-direction. In this case, the conductive material may have a pointed end portion.

According to the drawing, the anisotropic conductive film may be a fixed array anisotropic conductive film (ACF) configured with a form in which conductive balls are inserted into one surface of the insulating base member. More specifically, the insulating base member is formed of an adhesive material, and the conductive balls are intensively disposed at a bottom portion of the insulating base member, and when heat and pressure are applied thereto, the base member is modified along with the conductive balls, thereby having conductivity in the vertical direction thereof.

However, the present disclosure may not be necessarily limited to this, and the anisotropic conductive film may be all allowed to have a form in which conductive balls are randomly mixed with an insulating base member or a form configured with a plurality of layers in which conductive balls are disposed at any one layer (double-ACF), and the like.

The anisotropic conductive paste as a form coupled to a paste and conductive balls may be a paste in which conductive balls are mixed with an insulating and adhesive base material. Furthermore, a solution containing conductive particles may be a solution in a form containing conductive particles or nano particles.

Referring to the drawing again, the second electrode 140 is located at the insulating layer 160 to be separated from the auxiliary electrode 170. In other words, the conductive adhesive layer 130 is disposed on the insulating layer 160 located with the auxiliary electrode 170 and second electrode 140.

When the conductive adhesive layer 130 is formed in a state that the auxiliary electrode 170 and second electrode 140 are located, and then the semiconductor light emitting device 150 is connect thereto in a flip chip form with the application of heat and pressure, the semiconductor light emitting device 150 is electrically connected to the first electrode 120 and second electrode 140.

Referring to FIG. 4, the semiconductor light emitting device may be a flip chip type semiconductor light emitting device.

For example, the semiconductor light emitting device may include a p-type electrode 156, a p-type semiconductor layer 155 formed with the p-type electrode 156, an active layer 154 formed on the p-type semiconductor layer 155, an n-type semiconductor layer 153 formed on the active layer 154, and an n-type electrode 152 disposed to be separated from the p-type electrode 156 in the horizontal direction on the n-type semiconductor layer 153. In this case, the p-type electrode 156 may be electrically connected to the welding portion 179 by the conductive adhesive layer 130, and the n-type electrode 152 may be electrically connected to the second electrode 140.

Referring to FIGS. 2, 3A and 3B again, the auxiliary electrode 170 may be formed in an elongated manner in one direction to be electrically connected to a plurality of semiconductor light emitting devices 150. For example, the left and right p-type electrodes of the semiconductor light emitting devices around the auxiliary electrode may be electrically connected to one auxiliary electrode.

More specifically, the semiconductor light emitting device 150 is pressed into the conductive adhesive layer 130, and through this, only a portion between the p-type electrode 156 and auxiliary electrode 170 of the semiconductor light emitting device 150 and a portion between the n-type electrode 152 and second electrode 140 of the semiconductor light emitting device 150 have conductivity, and the remaining portion does not have conductivity since there is no push-down of the semiconductor light emitting device.

Furthermore, a plurality of semiconductor light emitting devices 150 constitute a light-emitting array, and a phosphor layer 180 is formed on the light-emitting array.

The light emitting device may include a plurality of semiconductor light emitting devices with different self luminance values. Each of the semiconductor light emitting devices 150 constitutes a sub-pixel, and is electrically connected to the first electrode 120. For example, there may exist a plurality of first electrodes 120, and the semiconductor light emitting devices are arranged in several rows, for instance, and each row of the semiconductor light emitting devices may be electrically connected to any one of the plurality of first electrodes.

Furthermore, the semiconductor light emitting devices may be connected in a flip chip form, and thus semiconductor light emitting devices grown on a transparent dielectric substrate. Furthermore, the semiconductor light emitting devices may be nitride semiconductor light emitting devices, for instance. The semiconductor light emitting device 150 has an excellent luminance characteristic, and thus it may be possible to configure individual sub-pixels even with a small size thereof.

According to the drawing, a partition wall 190 may be formed between the semiconductor light emitting devices 150. In this case, the partition wall 190 may perform the role of dividing individual sub-pixels from one another, and be formed as an integral body with the conductive adhesive layer 130. For example, a base member of the anisotropic conductive film may form the partition wall when the semiconductor light emitting device 150 is inserted into the anisotropic conductive film.

Furthermore, when the base member of the anisotropic conductive film is black, the partition wall 190 may have reflective characteristics while at the same time increasing contrast with no additional black insulator.

For another example, a reflective partition wall may be separately provided with the partition wall 190. In this case, the partition wall 190 may include a black or white insulator according to the purpose of the display device. It may have an effect of enhancing reflectivity when the partition wall of the while insulator is used, and increase contrast while at the same time having reflective characteristics.

The phosphor layer 180 may be located at an outer surface of the semiconductor light emitting device 150. For example, the semiconductor light emitting device 150 is a blue semiconductor light emitting device that emits blue (B) light, and the phosphor layer 180 performs the role of converting the blue (B) light into the color of a sub-pixel. The phosphor layer 180 may be a red phosphor layer 181 or green phosphor layer 182 constituting individual pixels.

In other words, a red phosphor 181 capable of converting blue light into red (R) light may be deposited on the blue semiconductor light emitting device 151 at a location implementing a red sub-pixel, and a green phosphor 182 capable of converting blue light into green (G) light may be deposited on the blue semiconductor light emitting device 151 at a location implementing a green sub-pixel. Furthermore, only the blue semiconductor light emitting device 151 may be solely used at a location implementing a blue sub-pixel. In this case, the red (R), green (G) and blue (B) sub-pixels may implement one pixel. More specifically, one color phosphor may be deposited along each line of the first electrode 120. Accordingly, one line on the first electrode 120 may be an electrode controlling one color. In other words, red (R), green (B) and blue (B) may be sequentially disposed, thereby implementing sub-pixels.

However, the present disclosure may not be necessarily limited to this, and the semiconductor light emitting device 150 may be combined with a quantum dot (QD) instead of a phosphor to implement sub-pixels such as red (R), green (G) and blue (B).

Furthermore, a black matrix 191 may be disposed between each phosphor layer to enhance contrast. In other words, the black matrix 191 can enhance the contrast of luminance.

However, the present disclosure may not be necessarily limited to this, and another structure for implementing blue, red and green may be also applicable thereto.

Figure 5A:
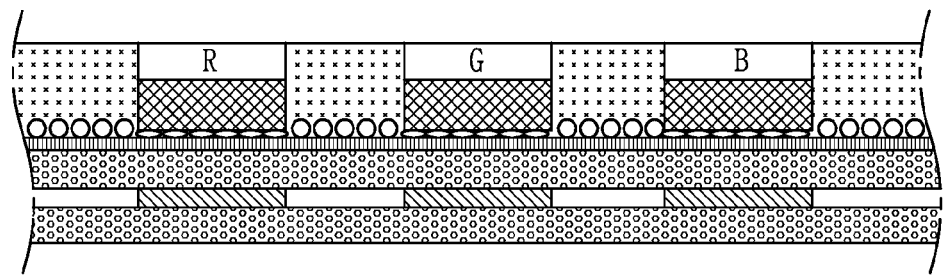
FIGS. 5A through 5C are conceptual views illustrating various forms for implementing colors in connection with a flip-chip type semiconductor light emitting device.

Referring to FIG. 5A, each of the semiconductor light emitting devices 150 may be implemented with a high-power light emitting device that emits various lights including blue in which gallium nitride (GaN) is mostly used, and indium (In) and or aluminum (Al) are added thereto.

In this case, the semiconductor light emitting device 150 may be red, green and blue semiconductor light emitting devices, respectively, to implement each sub-pixel. For instance, red, green and blue semiconductor light emitting devices (R, G, B) are alternately disposed, and red, green and blue sub-pixels implement one pixel by means of the red, green and blue semiconductor light emitting devices, thereby implementing a full color display.

Figure 5B:
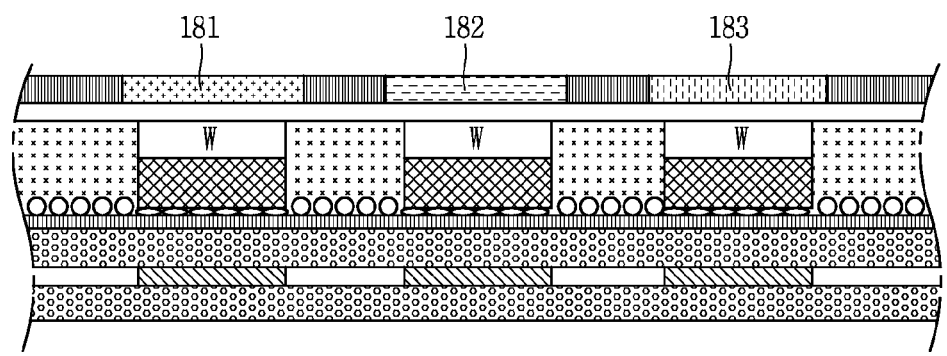

Referring to FIG. 5B, the semiconductor light emitting device may have a white light emitting device (W) provided with a yellow phosphor layer for each element. In this case, a red phosphor layer 181, a green phosphor layer 182 and blue phosphor layer 183 may be provided on the white light emitting device (W) to implement a sub-pixel. Furthermore, a color filter repeated with red, green and blue on the white light emitting device (W) may be used to implement a sub-pixel.

Figure 5C:
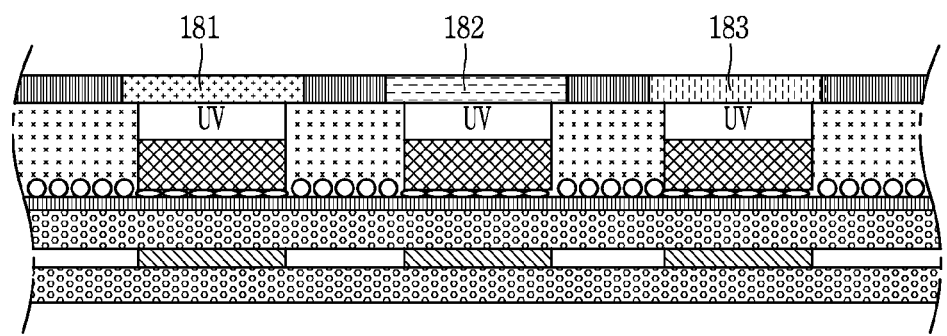

Referring to FIG. 5C, it may be possible to also have a structure in which a red phosphor layer 181, a green phosphor layer 182 and blue phosphor layer 183 may be provided on a ultra violet light emitting device (UV). In this manner, the semiconductor light emitting device can be used over the entire region up to ultra violet (UV) as well as visible light, and may be extended to a form of semiconductor light emitting device in which ultra violet (UV) can be used as an excitation source.

Taking the present example into consideration again, the semiconductor light emitting device 150 is placed on the conductive adhesive layer 130 to configure a sub-pixel in the display device. The semiconductor light emitting device 150 may have excellent luminance characteristics, and thus it may be possible to configure individual sub-pixels even with a small size thereof. The size of the individual semiconductor light emitting device 150 may be less than 80 µm in the length of one side thereof, and formed with a rectangular or square shaped element. In case of a rectangular shaped element, the size thereof may be less than 20×80 µm.

Furthermore, even when a square shaped semiconductor light emitting device 150 with a length of side of 10 µm is used for a sub-pixel, it will exhibit a sufficient brightness for implementing a display device. Accordingly, for example, in case of a rectangular pixel in which one side of a sub-pixel is 600 µm in size, and the remaining one side thereof is 300 µm, a relative distance between the semiconductor light emitting devices becomes sufficiently large. Accordingly, in this case, it may be possible to implement a flexible display device having a HD image quality.

A display device using the foregoing semiconductor light emitting device will be fabricated by a new type of fabrication method. Hereinafter, the fabrication method will be described with reference to FIG. 6.

Figure 6:
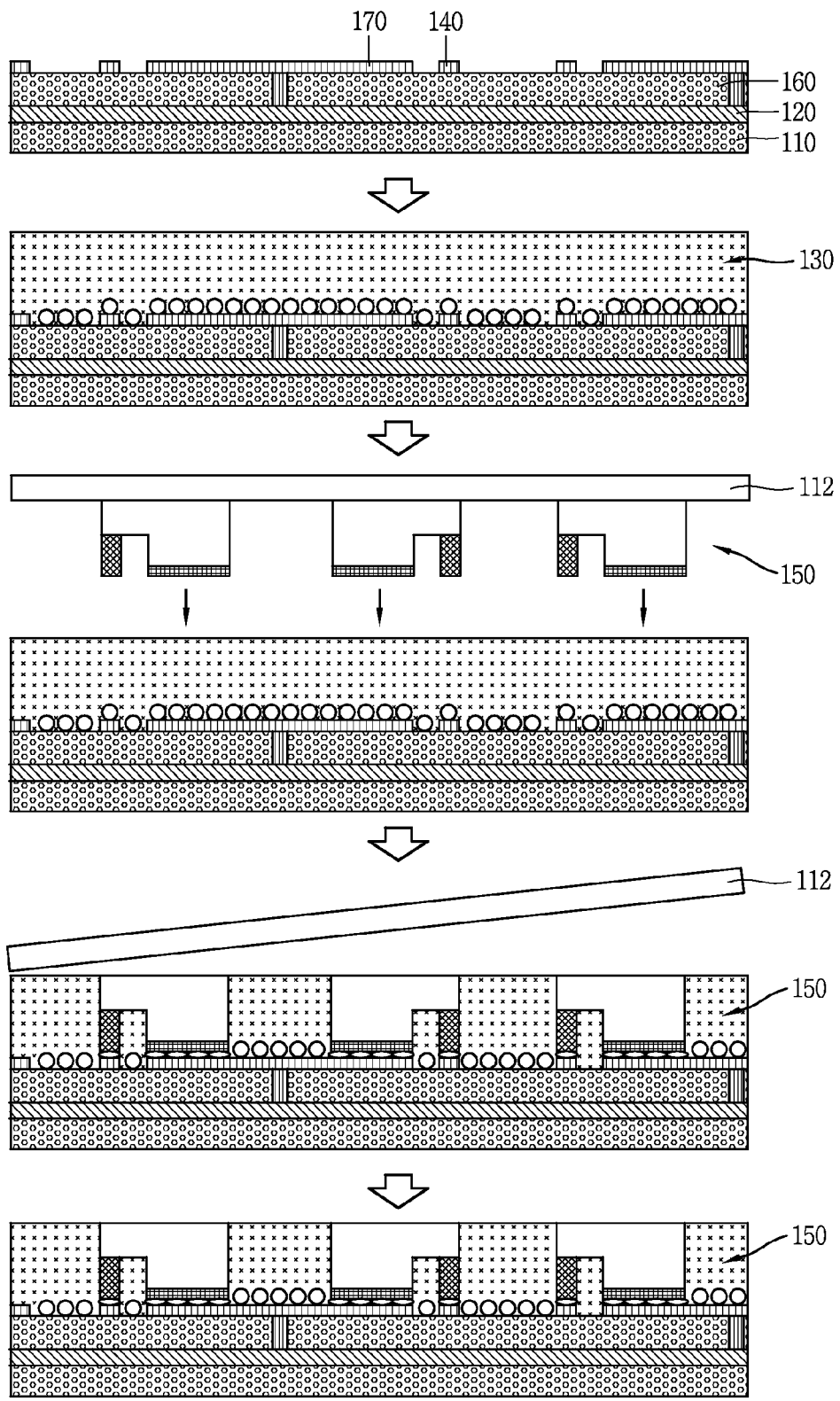
FIG. 6 is cross-sectional views illustrating a method of fabricating a display device using a semiconductor light emitting device according to the present disclosure.

FIG. 6 is cross-sectional views illustrating a method of fabricating a display device using a semiconductor light emitting device according to the present disclosure.

Referring to the drawing, first, the conductive adhesive layer 130 is formed on the insulating layer 160 located with the auxiliary electrode 170 and second electrode 140. The insulating layer 160 is deposited on the first substrate 110 to form one substrate (or wiring substrate), and the first electrode 120, auxiliary electrode 170 and second electrode 140 are disposed at the wiring substrate. In this case, the first electrode 120 and second electrode 140 may be disposed in a perpendicular direction to each other. Furthermore, the first substrate 110 and insulating layer 160 may contain glass or polyimide (PI), respectively, to implement a flexible display device.

The conductive adhesive layer 130 may be implemented by an anisotropic conductive film, for example, and to this end, an anisotropic conductive film may be coated on a substrate located with the insulating layer 160.

Next, a second substrate 112 located with a plurality of semiconductor light emitting devices 150 corresponding to the location of the auxiliary electrodes 170 and second electrodes 140 and constituting individual pixels is disposed such that the semiconductor light emitting device 150 faces the auxiliary electrode 170 and second electrode 140.

In this case, the second substrate 112 as a growth substrate for growing the semiconductor light emitting device 150 may be a sapphire substrate or silicon substrate.

The semiconductor light emitting device may have a gap and size capable of implementing a display device when formed in the unit of wafer, and thus effectively used for a display device.

Next, the wiring substrate is thermally compressed to the second substrate 112. For example, the wiring substrate and second substrate 112 may be thermally compressed to each other by applying an ACF press head. The wiring substrate and second substrate 112 are bonded to each other using the thermal compression. Only a portion between the semiconductor light emitting device 150 and the auxiliary electrode 170 and second electrode 140 may have conductivity due to the characteristics of an anisotropic conductive film having conductivity by thermal compression, thereby allowing the electrodes and semiconductor light emitting device 150 to be electrically connected to each other. At this time, the semiconductor light emitting device 150 may be inserted into the anisotropic conductive film, thereby forming a partition wall between the semiconductor light emitting devices 150.

Next, the second substrate 112 is removed. For example, the second substrate 112 may be removed using a laser lift-off (LLO) or chemical lift-off (CLO) method.

Finally, the second substrate 112 is removed to expose the semiconductor light emitting devices 150 to the outside. Silicon oxide (SiOx) or the like may be coated on the wiring substrate coupled to the semiconductor light emitting device 150 to form a transparent insulating layer (not shown).

Furthermore, it may further include the process of forming a phosphor layer on one surface of the semiconductor light emitting device 150. For example, the semiconductor light emitting device 150 may be a blue semiconductor light emitting device for emitting blue (B) light, and red or green phosphor for converting the blue (B) light into the color of the sub-pixel may form a layer on one surface of the blue semiconductor light emitting device.

The fabrication method or structure of a display device using the foregoing semiconductor light emitting device may be modified in various forms. For such an example, the foregoing display device may be applicable to a vertical semiconductor light emitting device. Hereinafter, the vertical structure will be described with reference to FIGS. 5 and 6.

Furthermore, according to the following modified example or embodiment, the same or similar reference numerals are designated to the same or similar configurations to the foregoing example, and the description thereof will be substituted by the earlier description.

Figure 7:
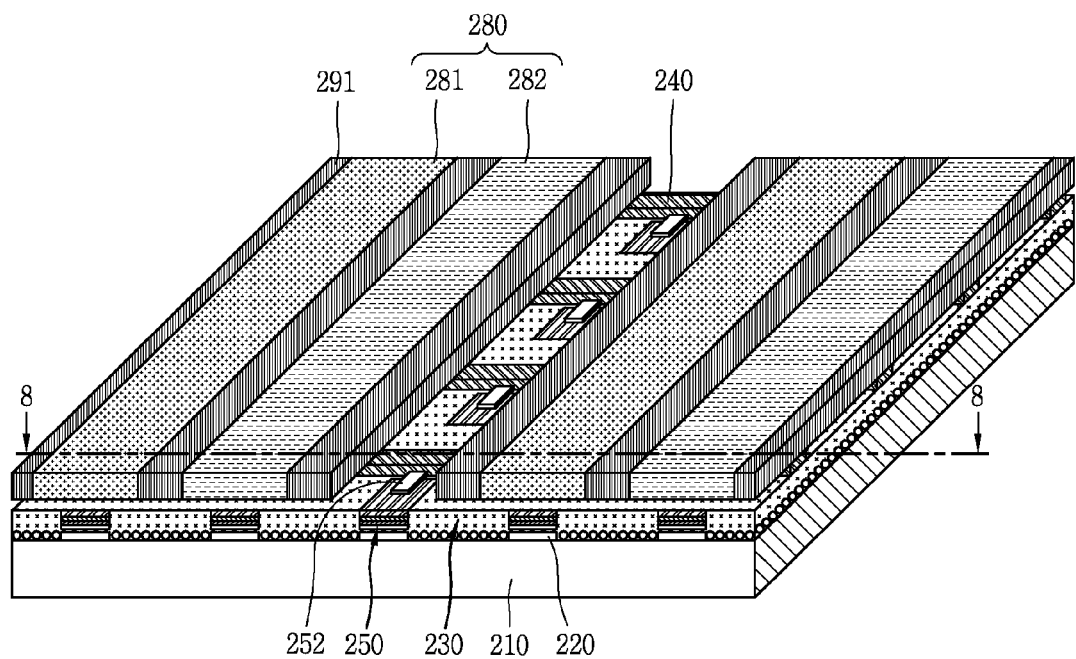
FIG. 7 is a perspective view illustrating a display device using a semiconductor light emitting device according to another embodiment of the present disclosure.
Figure 8:
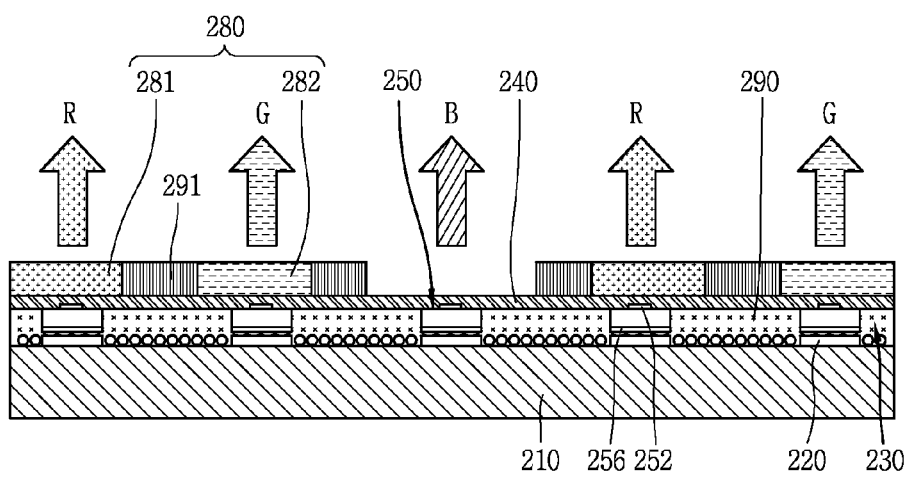
FIG. 8 is a cross-sectional view taken along line 8-8 in FIG. 7.
Figure 9:
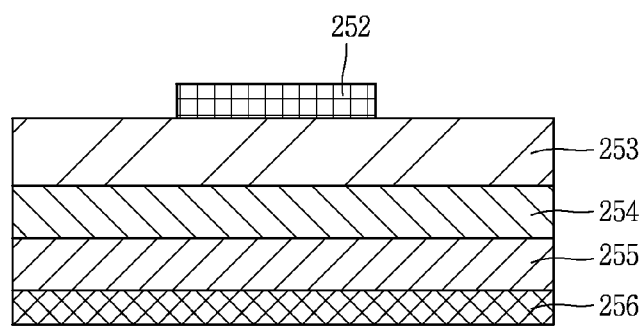
FIG. 9 is a conceptual view illustrating a vertical type semiconductor light emitting device in FIG. 8.

FIG. 7 is a perspective view illustrating a display device using a semiconductor light emitting device according to another embodiment of the present disclosure. FIG. 8 is a cross-sectional view taken along line 8-8 in FIG. 7, and FIG. 9 is a conceptual view illustrating a vertical type semiconductor light emitting device in FIG. 8.

According to the drawings, the display device may be display device using a passive matrix (PM) type of vertical semiconductor light emitting device.

The display device may include a substrate 210, a first electrode 220, a conductive adhesive layer 230, a second electrode 240 and a plurality of semiconductor light emitting devices 250.

The substrate 210 as a wiring substrate disposed with the first electrode 220 may include polyimide (PI) to implement a flexible display device. In addition, any one may be used if it is an insulating and flexible material.

The first electrode 220 may be located on the substrate 210, and formed with an electrode having a bar elongated in one direction. The first electrode 220 may be formed to perform the role of a data electrode.

The conductive adhesive layer 230 is formed on the substrate 210 located with the first electrode 220. Similarly to a display device to which a flip chip type light emitting device is applied, the conductive adhesive layer 230 may be an anisotropic conductive film (ACF), an anisotropic conductive paste, a solution containing conductive particles, and the like. However, the present embodiment illustrates a case where the conductive adhesive layer 230 is implemented by an anisotropic conductive film.

When an anisotropic conductive film is located in a state that the first electrode 220 is located on the substrate 210, and then heat and pressure are applied to connect the semiconductor light emitting device 250 thereto, the semiconductor light emitting device 250 is electrically connected to the first electrode 220. At this time, the semiconductor light emitting device 250 may be preferably disposed on the first electrode 220.

The electrical connection is generated because an anisotropic conductive film partially has conductivity in the thickness direction when heat and pressure are applied as described above. Accordingly, the anisotropic conductive film is partitioned into a portion having conductivity and a portion having no conductivity in the thickness direction thereof.

Furthermore, the anisotropic conductive film contains an adhesive component, and thus the conductive adhesive layer 230 implements a mechanical coupling as well as an electrical coupling between the semiconductor light emitting device 250 and the first electrode 220.

In this manner, the semiconductor light emitting device 250 is placed on the conductive adhesive layer 230, thereby configuring a separate sub-pixel in the display device. The semiconductor light emitting device 250 may have excellent luminance characteristics, and thus it may be possible to configure individual sub-pixels even with a small size thereof. The size of the individual semiconductor light emitting device 250 may be less than 80 μm in the length of one side thereof, and formed with a rectangular or square shaped element. In case of a rectangular shaped element, the size thereof may be less than 20×80 μm.

The semiconductor light emitting device 250 may be a vertical structure.

A plurality of second electrodes 240 disposed in a direction crossed with the length direction of the first electrode 220, and electrically connected to the vertical semiconductor light emitting device 250 may be located between vertical semiconductor light emitting devices.

Referring to FIG. 9, the vertical semiconductor light emitting device may include a p-type electrode 256, a p-type semiconductor layer 255 formed with the p-type electrode 256, an active layer 254 formed on the p-type semiconductor layer 255, an n-type semiconductor layer 253 formed on the active layer 254, and an n-type electrode 252 formed on the n-type semiconductor layer 253. In this case, the p-type electrode 256 located at the bottom thereof may be electrically connected to the first electrode 220 by the conductive adhesive layer 230, and the n-type electrode 252 located at the top thereof may be electrically connected to the second electrode 240 which will be described later. The electrodes may be disposed in the upward/downward direction in the vertical semiconductor light emitting device 250, thereby providing a great advantage capable of reducing the chip size.

Referring to FIG. 8 again, a phosphor layer 280 may be formed on one surface of the semiconductor light emitting device 250. For example, the semiconductor light emitting device 250 is a blue semiconductor light emitting device 251 that emits blue (B) light, and the phosphor layer 280 for converting the blue (B) light into the color of the sub-pixel may be provided thereon. In this case, the phosphor layer 280 may be a red phosphor 281 and a green phosphor 282 constituting individual pixels.

In other words, a red phosphor 281 capable of converting blue light into red (R) light may be deposited on the blue semiconductor light emitting device 251 at a location implementing a red sub-pixel, and a green phosphor 282 capable of converting blue light into green (G) light may be deposited on the blue semiconductor light emitting device 251 at a location implementing a green sub-pixel. Furthermore, only the blue semiconductor light emitting device 251 may be solely used at a location implementing a blue sub-pixel. In this case, the red (R), green (G) and blue (B) sub-pixels may implement one pixel.

However, the present disclosure may not be necessarily limited to this, and another structure for implementing blue, red and green may be also applicable thereto as described above in a display device to which a flip chip type light emitting device is applied.

Taking the present embodiment into consideration again, the second electrode 240 is located between the semiconductor light emitting devices 250, and electrically connected to the semiconductor light emitting devices 250. For example, the semiconductor light emitting devices 250 may be disposed in a plurality of rows, and the second electrode 240 may be located between the rows of the semiconductor light emitting devices 250.

Since a distance between the semiconductor light emitting devices 250 constituting individual pixels is sufficiently large, the second electrode 240 may be located between the semiconductor light emitting devices 250.

The second electrode 240 may be formed with an electrode having a bar elongated in one direction, and disposed in a perpendicular direction to the first electrode.

Furthermore, the second electrode 240 may be electrically connected to the semiconductor light emitting device 250 by a connecting electrode protruded from the second electrode 240. More specifically, the connecting electrode may be an n-type electrode of the semiconductor light emitting device 250. For example, the n-type electrode is formed with an ohmic electrode for ohmic contact, and the second electrode covers at least part of the ohmic electrode by printing or deposition. Through this, the second electrode 240 may be electrically connected to the n-type electrode of the semiconductor light emitting device 250.

According to the drawing, the second electrode 240 may be located on the conductive adhesive layer 230. According to circumstances, a transparent insulating layer (not shown) containing silicon oxide (SiOx) may be formed on the substrate 210 formed with the semiconductor light emitting device 250. When the transparent insulating layer is formed and then the second electrode 240 is placed thereon, the second electrode 240 may be located on the transparent insulating layer. Furthermore, the second electrode 240 may be formed to be separated from the conductive adhesive layer 230 or transparent insulating layer.

If a transparent electrode such as indium tin oxide (ITO) is used to locate the second electrode 240 on the semiconductor light emitting device 250, the ITO material has a problem of bad adhesiveness with an n-type semiconductor. Accordingly, the second electrode 240 may be placed between the semiconductor light emitting devices 250, thereby obtaining an advantage in which the transparent electrode is not required. Accordingly, an n-type semiconductor layer and a conductive material having a good adhesiveness may be used as a horizontal electrode without being restricted by the selection of a transparent material, thereby enhancing the light extraction efficiency.

According to the drawing, a partition wall 290 may be formed between the semiconductor light emitting devices 250. In other words, the partition wall 290 may be disposed between the vertical semiconductor light emitting devices 250 to isolate the semiconductor light emitting device 250 constituting individual pixels. In this case, the partition wall 290 may perform the role of dividing individual sub-pixels from one another, and be formed as an integral body with the conductive adhesive layer 230. For example, a base member of the anisotropic conductive film may form the partition wall when the semiconductor light emitting device 250 is inserted into the anisotropic conductive film.

Furthermore, when the base member of the anisotropic conductive film is black, the partition wall 290 may have reflective characteristics while at the same time increasing contrast with no additional black insulator.

For another example, a reflective partition wall may be separately provided with the partition wall 290. In this case, the partition wall 290 may include a black or white insulator according to the purpose of the display device.

If the second electrode 240 is precisely located on the conductive adhesive layer 230 between the semiconductor light emitting devices 250, the partition wall 290 may be located between the semiconductor light emitting device 250 and second electrode 240. Accordingly, individual sub-pixels may be configured even with a small size using the semiconductor light emitting device 250, and a distance between the semiconductor light emitting devices 250 may be relatively sufficiently large to place the second electrode 240 between the semiconductor light emitting devices 250, thereby having the effect of implementing a flexible display device having a HD image quality.

Furthermore, according to the drawing, a black matrix 291 may be disposed between each phosphor layer to enhance contrast. In other words, the black matrix 191 can enhance the contrast of luminance.

As described above, the semiconductor light emitting device 250 is located on the conductive adhesive layer 230, thereby constituting individual pixels on the display device. Since the semiconductor light emitting device 250 has excellent luminance characteristics, thereby configuring individual sub-pixels even with a small size thereof. As a result, it may be possible to implement a full color display in which the sub-pixels of red (R), green (G) and blue (B) implement one pixel by means of the semiconductor light emitting device.

As described above, in a display device using a semiconductor light emitting device according to the present disclosure, a structure in which red, green and blue semiconductor light emitting devices form a sub-pixel may be taken into consideration as illustrated in FIG. 5A, and hereinafter, the structure will be described in more detail.

Figure 10:
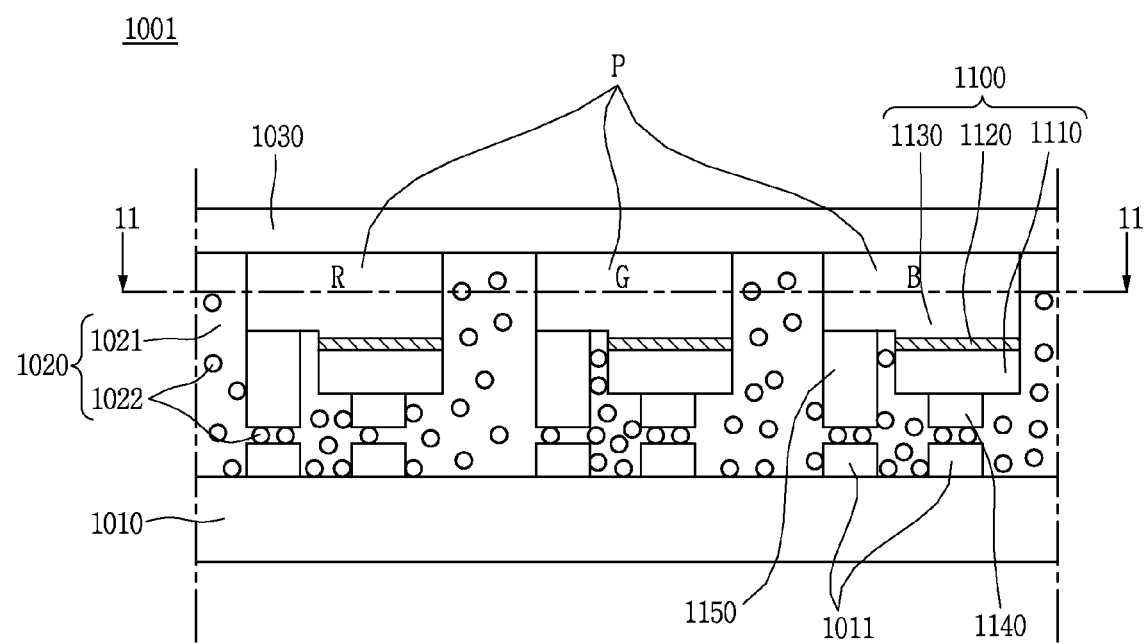
FIG. 10 is a partial cross-sectional view illustrating a display device according to an embodiment of the present disclosure.
Figure 11:
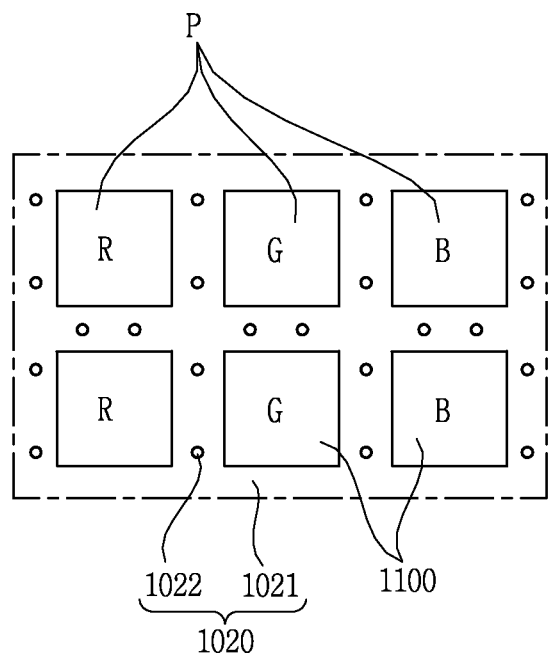
FIG. 11 is a cross-sectional view taken along line 11-11 in FIG. 10.
Figure 12:
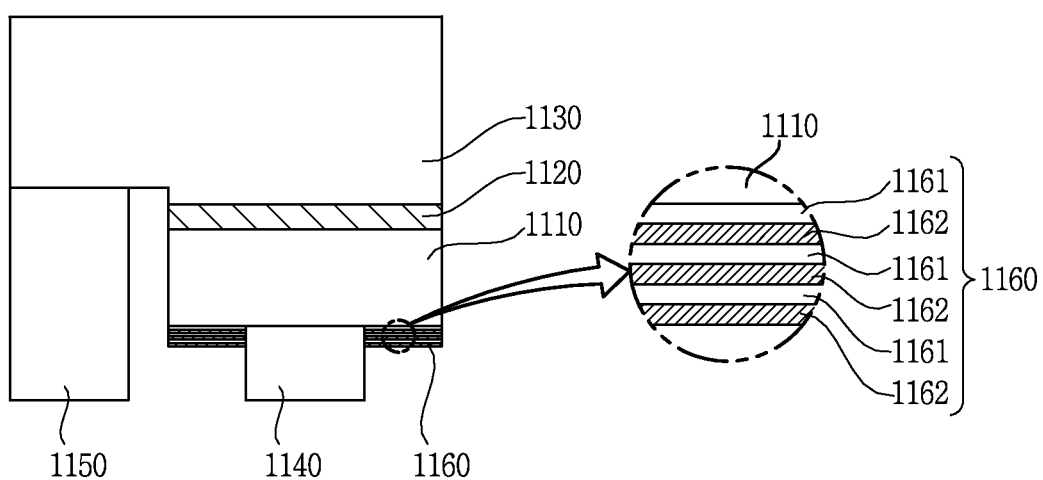
FIG. 12 is a cross-sectional view illustrating a semiconductor light emitting device in FIG. 10.

FIG. 10 is a partial cross-sectional view illustrating a display device according to an embodiment of the present disclosure, and FIG. 11 is a cross-sectional view taken along line 11-11 in FIG. 10, and FIG. 12 is a cross-sectional view illustrating a semiconductor light emitting device in FIG. 10.

Referring to FIGS. 10 and 11, a display device 1001 may include a lower substrate 1010 disposed with a line electrode 1011 at an upper portion thereof, a plurality of semiconductor light emitting devices 1100 located on the line electrode 1011 to generate light, and a conductive adhesive layer 1020 including a body 1021 configured to fix the location of the lower substrate 1010 to that of the semiconductor light emitting device 1100, and conductors 1022 dispersed within the body 1021 to electrically connect the lower substrate 1010 to the semiconductor light emitting device 1100.

The lower substrate 1010 may have a film shape with an insulating material. For example, the lower substrate 1010 may be made of a glass material or made of a transparent plastic or polymer film with excellent flexibility.

More specifically, the lower substrate 1010 may be a flexible substrate. For example, the lower substrate 1010 may include glass or polyimide (PI) to implement a flexible display device. In addition, any one may be used if it is an insulating and flexible material, for example, polyethylene naphthalate (PEN), polyethylene terephthalate (PET), and the like. Furthermore, the lower substrate 1010 may include either one of a transparent and a non-transparent material as illustrated in FIG. 5A.

A line electrode 1011 may be disposed at a location corresponding to the semiconductor light emitting device 1100 on a lower substrate 1010 thereof.

The line electrode 1011 may commonly refer to a second electrode 140 (refer to FIG. 3A) and an auxiliary electrode 170 (refer to FIG. 3A) on the substrate described with reference to FIGS. 3A and 3B.

More specifically, the line electrode 1011 may be disposed to correspond to (be vertically overlapped with) a location of the first conductive electrode 1140 and a second conductive electrode 1150 of the semiconductor light emitting device 1100. Furthermore, the line electrode 1011 may be formed to be protruded in the direction of the semiconductor light emitting device 1100 from the lower substrate 1010 to facilitate a contact between the first electrode 1140 and second electrode 1150 of the semiconductor light emitting device 1100. Of course, the line electrode 1011 may be buried and exposed on the lower substrate 1010. However, the present disclosure may not be necessarily limited to this.

The line electrode 1011 may include a conductive material, and for example, a metal selected from a group consisting of In, Co, Si, Ge, Au, Pd, Pt, Ru, Re, Mg, Zn, Hf, Ta, Rh, Ir, W, Ti, Ag, Cr, Mo, Nb, Al, Ni, Cu, and WTi, or include an alloy thereof, and formed with a single layer or multiple layers. Otherwise, the line electrode 1011 may be formed of a light transmitting material, and for example, formed by including at least one of ITO, IZO(In—ZnO), GZO(Ga—ZnO), AZO (Al—ZnO), AGZO(Al—Ga ZnO), IGZO(In—Ga ZnO), IrOx, RuOx, RuOx/ITO, Ni/IrOx/Au and Ni/IrOx/Au/ITO.

The line electrode 1011 is formed using a deposition method such as sputtering the foregoing conductive material on the lower substrate 1010. Subsequently, a metal layer may be patterned and formed with a photolithographic process or etching process using a mask.

The line electrodes 1011 may be disposed to be crossed with each other, and a switching element (not shown) may be located at the foregoing cross-section.

The line electrode 1011 may be disposed in consideration of a pixel region (P) which will be described later.

Referring to FIGS. 10 and 12, the semiconductor light emitting device 1100 is located to correspond to the pixel region (P) on the line electrode 1011.

The pixel region (P) may be formed in such a manner that a plurality of semiconductor light emitting devices constitute a group.

The plurality of semiconductor light emitting devices 1100 may be disposed to be separated from each other in a stripe form along each row direction.

Furthermore, the plurality of semiconductor light emitting devices 1100 may form one pixel region (P) made of a red semiconductor light emitting device (R) 1100 that emits red light (about 700 nm in wavelength), a green semiconductor light emitting device (G) 1100 that emits green light (about 550 nm in wavelength), and a blue semiconductor light emitting device (B) 1100 that emits blue light (about 440 nm in wavelength) to generate various colors with a mixed color of the red semiconductor light emitting device (R) 1100, green semiconductor light emitting device (G) 1100, and blue semiconductor light emitting device (B) 1100. One pixel region (P) may be the foregoing sub-pixel, and a plurality of pixel regions (P) may display various images.

For example, when all the red semiconductor light emitting device (R) 1100, green semiconductor light emitting device (G) 1100, and blue semiconductor light emitting device (B) 1100 emit light, the pixel region (P) may emit white light. Furthermore, when the green semiconductor light emitting device (G) 1100 and blue semiconductor light emitting device (B) 1100, the pixel region (P) may emit white light.

The semiconductor light emitting device 1100 may be a semiconductor including an inorganic material.

In case of a liquid crystal display, there exist a problem such as not-so-fast response time, high current consumption due to a low efficiency of backlight unit, no guarantee of the two-year life span due to low reliability in organic materials in case of organic light emitting diodes (OLEDs), and very low yield of mass production.

According to an embodiment, an inorganic semiconductor light emitting device 1100 may be disposed at the pixel region (P), thereby having an advantage capable of implementing a high-speed screen with a fast response time.

Furthermore, an additional back light may be not required, thereby having an advantage of excellent luminance and excellent efficiency.

Furthermore, the semiconductor light emitting device 1100 may be an inorganic material, thereby having an advantage of long life span.

Furthermore, according to an embodiment, the semiconductor light emitting device 1100 may be disposed in a pixel unit, thereby having an advantage of being implemented easily with an active type.

The semiconductor light emitting devices 1100 may individually emit red, green and blue light, thereby having an advantage of not providing an additional color substrate.

For example, semiconductor light emitting device 1100 may be formed using a method such as metal organic chemical vapor deposition (MOCVD), chemical vapor deposition (CVD), plasma-enhanced chemical vapor deposition (PECVD), molecular beam epitaxy (MBE), hydride vapor phase epitaxy (HVPE), sputtering, and the like, but may not be necessarily limited to this.

For example, the semiconductor light emitting device 1100 may include a first conductive semiconductor layer 1110, an active layer 1120 located on the first conductive semiconductor layer 1110, and a second conductive semiconductor layer 1130 located on the active layer 1120.

The red semiconductor light emitting device (R) 1100, green semiconductor light emitting device (G) 1100 and blue semiconductor light emitting device (B) 1100 have the same structure, but there exists a difference between their composition materials. Hereinafter, unless specified otherwise, the description of the semiconductor light emitting device 1100 may be commonly applicable to the red semiconductor light emitting device (R) 1100, green semiconductor light emitting device (G) 1100, and blue semiconductor light emitting device (B) 1100.

The first conductive semiconductor layer 1110 may be formed of a semiconductor compound and doped with a first conductive dopant. For example, the first conductive semiconductor layer 1110 may be implemented with an n-type semiconductor layer, and electrons may be provided to the active layer 1120.

For example, the first conductive semiconductor layer 1110 of the red semiconductor light emitting device (R) 1100 may be selected from a semiconductor material having a composition formula of $(Al_xGa_{1-x})_{0.5}In_{0.5}P$ or GaAsP, for example, GaAsP, GaInP, AlInP and the like, and an n-type dopant such as Si, Ge, Sn, Se, Te and the like may be doped therein. Furthermore, the first conductive semiconductor layer 1110 of the green semiconductor light emitting device (G) 1100 may include GaP, and an n-type dopant such as Si, Ge, Sn, Se, Te and the like may be doped therein. Furthermore, the first conductive semiconductor layer 1110 of the blue semiconductor light emitting device (R) 1100 may be selected from a semiconductor material having a composition formula of $In_xAl_yGa_{1-x-y}N$ ($0 \leq x \leq 1$, $0 \leq y \leq 1$, $0 \leq x+y \leq 1$), for example, GaN, AlN, AlGaN, InGaN, InN, InAlGaN, AlInN and the like, and an n-type dopant such as Si, Ge, Sn, Se, Te and the like may be doped therein.

For another example, both the first conductive semiconductor layers 1110 of the red semiconductor light emitting device (R) 1100 and green semiconductor light emitting device (G) 1100 may include GaAsP, and there may exist a difference in the content of P. However, it may not be necessarily limited to this.

The active layer 1120 may be formed on the first conductive semiconductor layer 1110. The active layer 1120 is a region in which electrons are recombined with holes, and transits to a low energy level when electrons and holes are recombined, thereby generating light having a wavelength corresponding to this. Meanwhile, the active layer 1120 may be formed with a single or multiple quantum well structure, a quantum wire structure or quantum dot structure, and the like using a compound semiconductor material.

When the active layer 1120 is formed with a quantum well structure, it may have a single or multiple quantum well structure having a well layer and a barrier layer. The well layer may be formed of a material having a band gap lower than that of the barrier layer.

Furthermore, when the active layer 1120 is formed with a multiple quantum well structure, each well layer (not shown) may have a different band gap.

For example, the active layer 1120 of the red semiconductor light emitting device (R) 1100 may be selected from a semiconductor material having a composition formula of $(Al_xGa_{1-x})_{0.5}In_{0.5}P$ or GaAsP, for example, GaAsP, GaInP, AlInP and the like. Furthermore, the active layer 1120 of the green semiconductor light emitting device (G) 1100 may include GaP. Furthermore, the active layer 1120 of the blue semiconductor light emitting device (R) 1100 may be selected from a semiconductor material having a composition formula of $In_xAl_yGa_{1-x-y}N$ (0≤x≤1, 0≤y≤1, 0≤x+y≤1), for example, GaN, AlN, AlGaN, InGaN, InN, InAlGaN, AlInN and the like.

For another example, both the active layers 1120 of the red semiconductor light emitting device (R) 1100 and green semiconductor light emitting device (G) 1100 may include GaAsP, and there may exist a difference in the content of P. However, it may not be necessarily limited to this.

A conductive clad layer (not shown) may be formed above or/and below the active layer 1120. The conductive clad layer (not shown) may be formed of a semiconductor, and may have a band gap greater than that of the active layer 1120. For example, the conductive clad layer (not shown) may be formed to contain AlGaN.

The second conductive semiconductor layer 1130 may be formed of a semiconductor compound to inject holes to the active layer 1120, and a second conductive dopant may be doped therein. For example, the second conductive semiconductor layer 1130 may be implemented with a p-type semiconductor layer.

For example, the second conductive semiconductor layer 1130 of the red semiconductor light emitting device (R) 1100 may be selected from a semiconductor material having a composition formula of $(Al_xGa_{1-x})_{0.5}In_{0.5}P$ or GaAsP, for example, GaAsP, GaInP, AlInP and the like, and a p-type dopant such as Mg, Zn, Ca, Sr, Ba and the like may be doped therein. Furthermore, the second conductive semiconductor layer 1130 of the green semiconductor light emitting device (G) 1100 may include GaP, and a p-type dopant such as Mg, Zn, Ca, Sr, Ba and the like may be doped therein.

Furthermore, the second conductive semiconductor layer 1130 of the blue semiconductor light emitting device (R) 1100 may be selected from a semiconductor material having a composition formula of $In_xAl_yGa_{1-x-y}N$ (0≤x≤1, 0≤y≤1, 0≤x+y≤1), for example, GaN, AlN, AlGaN, InGaN, InN, InAlGaN, AlInN and the like, and a p-type dopant such as Mg, Zn, Ca, Sr, Ba and the like may be doped therein.

For another example, both the second conductive semiconductor layers 1130 of the red semiconductor light emitting device (R) 1100 and green semiconductor light emitting device (G) 1100 may include GaAsP, and there may exist a difference in the content of P. However, it may not be necessarily limited to this.

On the other hand, an electron blocking layer (not shown) may be formed between the active layer 1120 and second conductive semiconductor layer 1130, and the electron blocking layer may prevent a phenomenon in which electrons injected to the active layer 1120 from the first conductive semiconductor layer 1110 during the application of a high current flow to the second conductive semiconductor layer 1130 without being recombined at the active layer 1120. The electron blocking layer may have a band gap relatively greater than that of the active layer 1120, thereby preventing a phenomenon in which electrons injected from the first conductive semiconductor layer 1110 are injected to the second conductive semiconductor layer 1130 without being recombined at the active layer 1120. Accordingly, it may be possible to increase a probability of recombining electrons with holes at the active layer 1120 as well as suppress a leakage current.

Furthermore, the first conductive semiconductor layer 1110 may be implemented with a p-type semiconductor layer, and the second conductive semiconductor layer 1130 may be implemented with an n-type semiconductor layer, and a third semiconductor layer (not shown) including an n-type or p-type semiconductor layer having an opposite polarity to that of the second conductive semiconductor layer 1130 may be formed on the second conductive semiconductor layer 1130. Accordingly, the light emitting device may have at least any one of np, pn, npn, pnp junction structures.

A light transmitting electrode layer (not shown) may be formed on a lower surface of the first conductive semiconductor layer 1110. The transparent electrode layer may be formed by including at least one of ITO, IZO(In—ZnO), GZO(Ga—ZnO), AZO(Al—ZnO), AGZO(Al—Ga ZnO), IGZO(In—Ga ZnO), IrOx, RuOx, RuOx/ITO, Ni/IrOx/Au and Ni/IrOx/Au/ITO. Accordingly, the transparent electrode layer may be formed on the entire or partial lower surface of the first conductive semiconductor layer 1110, thereby preventing a current crowding phenomenon.

On the other hand, a first electrode 1140 electrically connected to the first conductive semiconductor layer 1110 may be disposed at the first conductive semiconductor layer 1110. For example, the first electrode 1140 may be formed on a lower surface of the first conductive semiconductor layer 1110.

Furthermore, a second electrode 1150 electrically connected to the second conductive semiconductor layer 1130 may be disposed at the second conductive semiconductor layer 1130.

For example, part of the active layer 1120 and first conductive semiconductor layer 1110 may be removed to expose part of a lower surface of the second conductive semiconductor layer 1130, and the first electrode 1140 may be formed on the exposed lower surface of the second conductive semiconductor layer 1130. Meanwhile, a method of exposing part of the first conductive semiconductor layer 1110 may use a predetermined etching method, but may not be necessarily limited to this. Furthermore, a wet or dry etching method may be used for the etching method.

The first electrode 1140 and second electrode 1150 may be formed with a deposition method such as sputtering and the like. However, it may not be necessarily limited to this.

The first electrode 1140 and second electrode 1150 may be disposed to be protruded in the direction of the lower substrate 1010 in the semiconductor light emitting device 1100. Furthermore, the lower surfaces of the first electrode 1140 and second electrode 1150 may be disposed on the same plane, thereby providing stability when the line electrode 1011 of the lower substrate 1010 is adhered to the semiconductor light emitting device 1100.

Furthermore, the first electrode 1140 and second electrode 1150 may be located in a lower region of the active layer 1120.

Since light generated from the active layer 1120 is not absorbed to the first electrode 1140 and second electrode 1150 while being advanced in the upward direction, thereby preventing the reduction of luminance and brightness from being caused due to an absorption of light into the first electrode 1140 and second electrode 1150.

On the other hand, the first electrode 1140 and second electrode 1150 may include a conductive material, and for example, a metal selected from a group consisting of In, Co, Si, Ge, Au, Pd, Pt, Ru, Re, Mg, Zn, Hf, Ta, Rh, Ir, W, Ti, Ag, Cr, Mo, Nb, Al, Ni, Cu, and WTi, or include an alloy thereof, and formed with a single layer or multiple layers, but may not be necessarily limited to this.

On the other hand, a lower surface of the first conductive semiconductor layer 1110 may further include a reflective layer 1160. Specifically, the reflective layer 1160 may be disposed in a region excluding a region in which the first electrode 1140 is located at a lower surface of the first conductive semiconductor layer 1110.

The reflective layer 1160 may form a structure in which layers with different refractive indices are deposited in an alternately repeated manner. For example, the reflective layer 1160 may at least include a first layer 1161 having a first refractive index and a second layer 1162 having a second refractive index different from the first refractive index. The first layer 1161 of the reflective layer 1160 may be a high refractive index layer and the second layer 1162 thereof may be a low refractive index layer. On the contrary, the first layer 1161 thereof may be a low refractive index layer, and the second layer 1162 thereof may be a high refractive index layer, but it may not be necessarily limited to this. The reflective layer 1160 may be deposited with 2 to 30 layers, but may not be necessarily limited to this.

In case where λ is a reference wavelength of light generated from the semiconductor light emitting device 1100, n is a refractive index of the medium, and m is an odd number, the reflective layer 1160 may be formed with a deposition layer in which the first layer 1161 having a high refractive index with a thickness of mλ/4n and the second layer 1162 having a low refractive index are deposited in an alternately repeated manner to obtain a reflective ratio greater than 95% over a specific bandwidth band of light.

The first layer 1161 having a high refractive index and the second layer 1162 having a low refractive index may have a thickness of λ/4 of the reference wavelength, and herein, each layer 1161, 1162 may be formed with a thickness of 2 Å to 10 μm. Furthermore, the thickness of the reflective layer 1160 may be 100 to 10000 Å, but may not be necessarily limited to this, and may be also less or greater than that. In addition, each layer 1161, 1162 forming the reflective layer 1160 may be formed of MxOy (M: Metal, O: Oxide, X, Y: constant). For example, the reflective layer 1160 may include any one of $SiO_2$, $Al_2O_3$, SiC, AlB, BN and $TiO_2$. However, it may not be necessarily limited to this. For example, the first layer 1161 having a high refractive index may include TiO2 having a refractive index greater than 2 or the like, and the second layer 1162 having a low refractive index may include $SiO_2$ with a refractive index of 1.4 or $Al_2O_3$ with a refractive index of 1.6. On the contrary, in case where the first layer 1161 has a low refractive index and the second layer 1162 has a high refractive index, the first layer 1161 may include $SiO_2$ or $Al_2O_3$ and the second layer 1162 may include $TiO_2$, but it may not be necessarily limited to this.

Accordingly, light generated from the active layer 1120 may be reflected on reflective layer 1160 to distribute light in the upward direction.

Referring to FIGS. 10 and 11 again, the conductive adhesive layer 1020 may be formed on one surface of the lower substrate 1010.

The conductive adhesive layer 1020 may be a layer having adhesiveness and conductivity, and to this end, a material having conductivity and a material having adhesiveness may be mixed at the conductive adhesive layer 1020. Furthermore, the conductive adhesive layer 1020 may have softness, thereby allowing a flexible function in a display device.

According to the drawing, the conductive adhesive layer 1020 according to the present example may include a body 1021 configured to fix the location of the lower substrate 1010 to that of the semiconductor light emitting device 1100, and conductors 1022 dispersed within the body 1021 to electrically connect the lower substrate 1010 to the semiconductor light emitting device 1100.

The conductive adhesive layer 1020 may include conductors 1022 having electrical conductivity. The conductive adhesive layer 1020 may be disposed such that the conductors 1022 are dispersed within the body 1021 having viscosity.

The conductive adhesive layer 1020 may be an anisotropic conductive film (ACF) made of an adhesive resin mixture containing the conductors 1022.

According to the present example, it is illustrated a case where the conductive adhesive layer 1020 is an anisotropic conductive film (ACF), and the anisotropic conductive film is formed in such a manner that conductive balls are randomly intermixed in an insulating base member. However, the present disclosure may not be necessarily limited to this, various forms of the conductive adhesive layer described with reference to FIGS. 3A and 3B may be all applicable to the present example. For such an example, the anisotropic conductive film may be formed with a fixed array anisotropic conductive film (ACF) or with a form in which the insulating base member is configured with a plurality of layers and conductive balls are disposed in any one layer thereof (double ACF), and the like.

The body 1021 having viscosity may be a resin mixture. For example, the body 1021 may include silicon (Si) resin, epoxy or acrylic resin.

The body 1021 may have electrical insulation. Furthermore, the body 1021 may have mobility.

The body 1021 may have adhesiveness. The body 1021 may include a thermoplastic adhesive such as styrene-based block copolymer, and the like, but may not be necessarily limited to this.

Furthermore, the body 1021 may include a thermosetting adhesive material such as epoxy resin and the like. The body 1021 may control its adhesiveness by controlling thickness, viscosity, flexibility, adhesion, impurity, elasticity, and the like.

Furthermore, the body 1021 may include a material for blocking a short wavelength region of light (blue light, ultra violet (UV) rays). For example, the body 1021 may include zinc oxide or titanium dioxide.

Furthermore, the body 1021 may include a material for blocking light generated from the semiconductor light emitting device 1100. For example, the body 1021 may include a non-transmitting synthetic resin that absorbs light.

Furthermore, the body 1021 may have black color. To this end, the body 1021 may include a material having black color. Accordingly, a region excluding the pixel region (P) is exhibited as black, thereby displaying a clear screen with a high contrast ratio.

The body 1021 blocks light generated from the semiconductor light emitting device 1100 to suppress optical interference between the adjoining pixel regions (Ps) and external light reflection.

The body 1021 may have mobility and thus be cured at a normal and high temperature, and cured by catalysis. Here, the high temperature denotes a temperature higher than the normal temperature.

The body 1021 may be disposed to surround at least the first electrode 1140 and second electrode 1150. More preferably, the body 1021 may be disposed to surround the first electrode 1140 and second electrode 1150 and a lateral surface and a lower surface of the semiconductor light emitting device 1100.

The body 1021 may perform the role of electrically connecting the first and the second electrode 1140, 1150 to the line electrode 1011, and adhering the lower substrate 1010 to the semiconductor light emitting device 1100, and surround the semiconductor light emitting device 1100 to block optical interference between the semiconductor light emitting devices 1100.

On the other hand, the body 1021 may be a transparent material. Accordingly, it may be possible to implement a display device with high transmittance and high luminance characteristics.

Furthermore, the body 1021 may isolate the semiconductor light emitting device 1100 from the outside to perform the role of protecting the semiconductor light emitting device 1100.

The location of conductors 1022 located within the body 1021 may be moved according to a pressure applied by the outside. The adhesive portion 1020 may be formed such that conductors 1022 are disposed in a regular or irregular manner within the body 1021.

The adhesive portion 1020 may control the size, shape, charge amount, dispersion state, thickness and the like of the conductors 1022 to change their conductivity. The adhesive portion 1020 may be changed in its thermal conductivity, adhesiveness, mobility and the like according to an increase of the content of the conductors 1022.

The conductors 1022 may be a metal particles such as nickel or particles in which a metal is coated on a resin, but may not be necessarily limited to the kinds thereof. In case of particles in which a metal is coated on a resin, the conductors 1022 may be formed such that a conductive material such as nickel, gold or the like are coated on a surface of polymer core body such as polystyrene resin, acrylic resin and the like.

The conductors 1022 may be disposed adjacent to the first electrode 1140, second electrode 1150 and line electrode 1011 to electrically connect the first electrode 1140 and second electrode 1150 to the line electrode 1011.

Specifically, the conductors 1022 may be located between the first electrode 1140 and second electrode 1150 and the line electrode 1011.

In other words, the adhesive portion 1020 may be formed such that the conductors 1022 are randomly located on the body 1021 having mobility, adhesiveness, and non-transparency.

The body 1021 having mobility is filled between the semiconductor light emitting device 1100 and lower substrate 1010 to selectively conduct the line electrode 1011 and semiconductor light emitting device 1100, and cured to fix the location of the semiconductor light emitting device 1100 to that of the lower substrate 1010.

A protective substrate 1030 for protecting the semiconductor light emitting device 1100 may be further provided on the semiconductor light emitting device 1100 and adhesive portion 1020.

The protective substrate 1030 may include a synthetic resin with a light transmitting material.

FIGS. 13 through 18 are a flow chart illustrating a method of fabricating a display device according to an embodiment. A method of fabricating the display device 1001 according to an embodiment will be described below.

Figure 13:
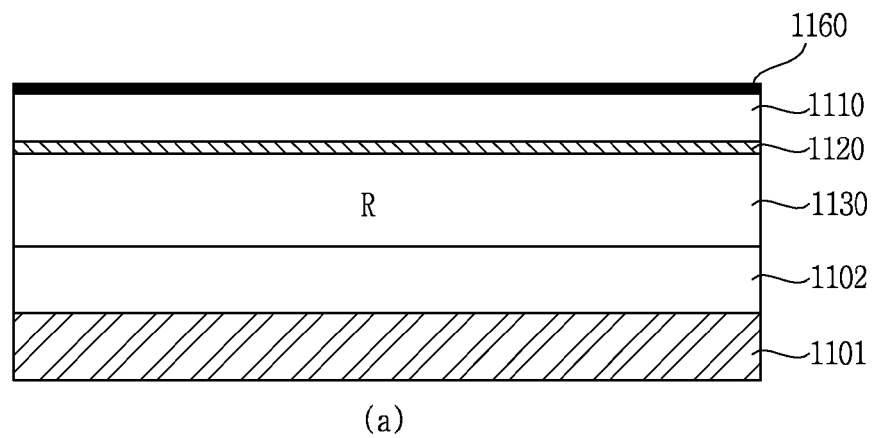
FIGS. 13 through 18 are a flow chart illustrating a method of fabricating a display device according to an embodiment.
Figure 13:
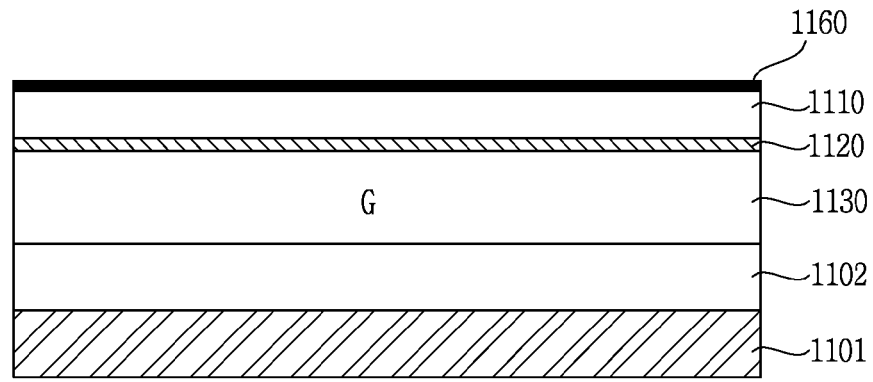
Figure 13:
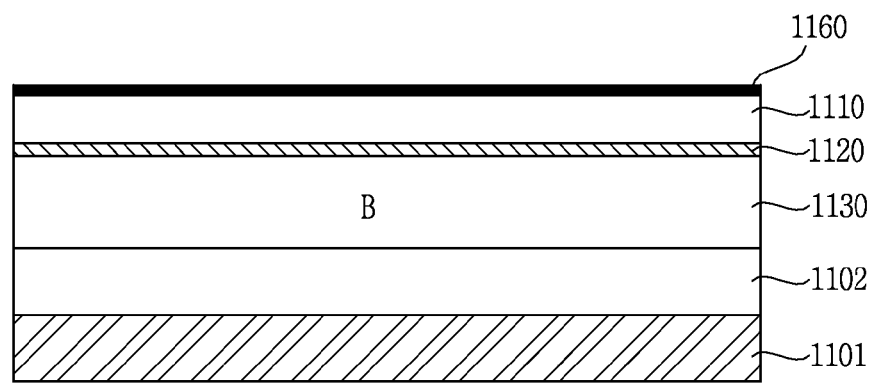

Referring to FIG. 13, each growth substrate corresponding to the red semiconductor light emitting device (R) 1100, green semiconductor light emitting device (G) 1100, and blue semiconductor light emitting device (B) 1100 is prepared.

The growth substrate 1101 (wafer) may be formed with a material having light transmitting properties, for example, including any one of sapphire ($Al_2O_3$), GaN, ZnO, and AlO, but may not be necessarily limited to this. Furthermore, the growth substrate 1101 may be formed of a material suitable to semiconductor material growth, namely, carrier wafer. Furthermore, the growth substrate 1101 may be formed of a material with excellent thermal conductivity characteristics, and may include a conductive substrate or insulating substrate to use an SiC substrate having a thermal conductivity greater than that of sapphire ($Al_2O_3$) substrate or any one of Si, GaAs, GaP, InP, and $Ga_2O_3$.

A buffer layer 1102 for alleviating a lattice mismatch between the growth substrate 1101 and first conductive semiconductor layer 1110 and allowing the semiconductor layer to be easily grown may be located on the growth substrate 1101. The buffer layer 1102 may be formed in a low temperature atmosphere, and made of a material capable of alleviating a lattice constant difference between the semiconductor layer and growth substrate 1101. For example, the buffer layer 1102 may include a material such as GaN, InN, AlN, AlInN, InGaN, AlGaN, and InAlGaN, but may not be necessarily limited to this.

The buffer layer 1102 may be grown as a single crystal on the growth substrate 1101, and the buffer layer 1102 grown as a single crystal may enhance the crystallinity of the first conductive semiconductor layer 1110 being grown on the buffer layer 1102.

A light emitting structure including the second conductive semiconductor layer 1130, the active layer 1120 located on the second conductive semiconductor layer 1130, and the first conductive semiconductor layer 1110 located on the active layer 1120 is grown on the buffer layer 1102. Of course, the constituent material of the light emitting structure of the red semiconductor light emitting device (R) 1100, green semiconductor light emitting device (G) 1100 and blue semiconductor light emitting device (B) 1100 is the same as described above, and separately grown.

A reflective layer 1163 is formed on the first conductive semiconductor layer 1110.

Figure 14:
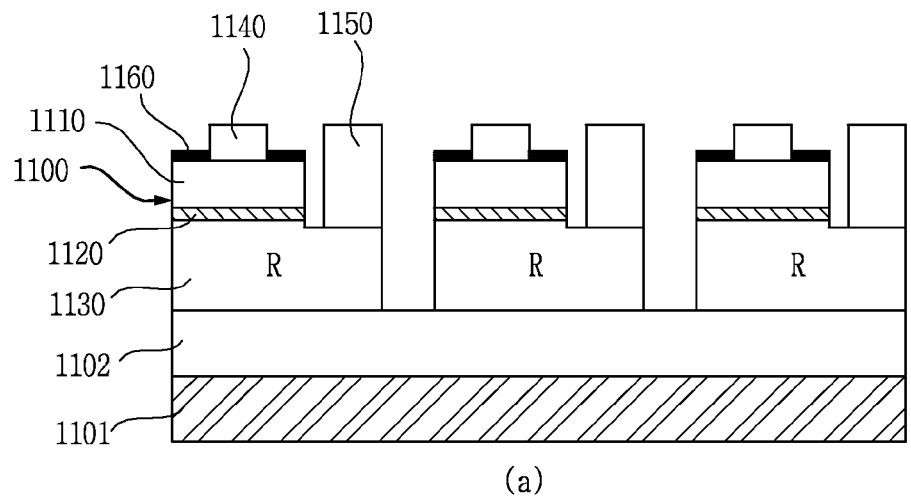
Figure 14:
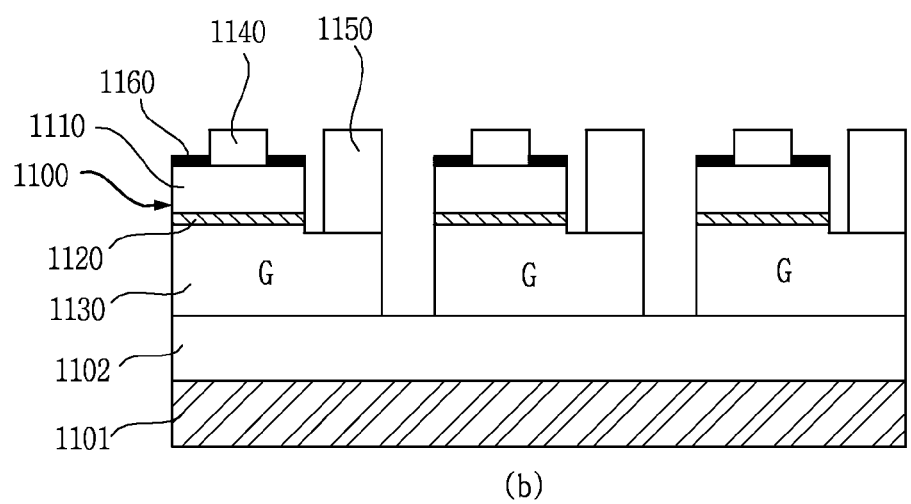
Figure 14:
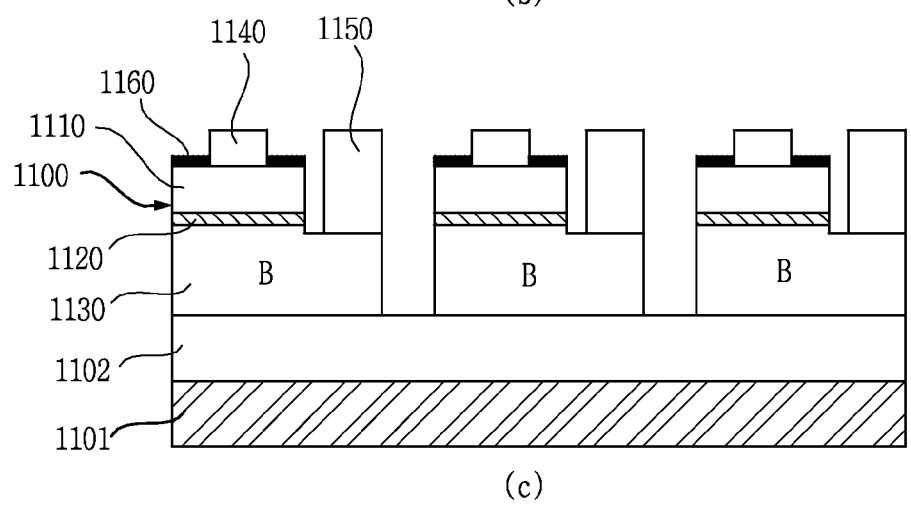

Referring to FIG. 14, the light emitting structure of the red semiconductor light emitting device (R) 1100, green semiconductor light emitting device (G) 1100, and blue semiconductor light emitting device (B) 1100 is partitioned for each semiconductor light emitting device 1100 in a chip unit. In other words, the first conductive semiconductor layer 1110, active layer 1120 and second conductive semiconductor layer 1130 may be removed in a matrix form.

For a method of partitioning the semiconductor light emitting device 1100 into each chip unit, wet etching, dry etching or laser lift off (LLO) methods may be used, but the present disclosure may not be necessarily limited to this.

Furthermore, one region of the first conductive semiconductor layer 1110 and active layer 1120 is removed to expose one region of the second conductive semiconductor layer 1130.

Then, the first electrode 1140 and second electrode 1150 are formed on an upper surface of the first conductive semiconductor layer 1110 and an upper surface of the exposed second conductive semiconductor layer 1130.

The first electrode 1140 and second electrode 1150 may be formed with a deposition method such as sputtering or the like. However, the present disclosure may not be necessarily limited to this.

Figure 15:
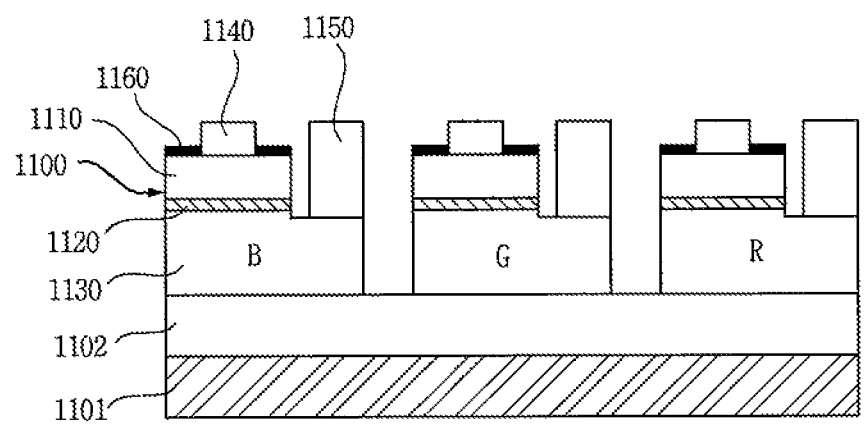

Referring to FIG. 15, the red semiconductor light emitting device (R) 1100 in a region at which the blue semiconductor light emitting device (B) 1100 and green semiconductor light emitting device (G) 1100 are located is removed from the partitioned red semiconductor light emitting devices (R) 1100 in a chip unit in the light emitting structure of the red semiconductor light emitting device (R) 1100.

The green semiconductor light emitting devices (G) 1100 and blue semiconductor light emitting devices (B) 1100 in a chip unit are adhered to a region from which the light emitting structure of the red semiconductor light emitting device (R) 1100 is removed so as to correspond them to the pixel region (P).

Of course, an additional substrate (not shown) may be provided to individually adhere the grown red semiconductor light emitting device (R) 1100, green semiconductor light emitting device (G) 1100, and blue semiconductor light emitting device (B) 1100 to the foregoing substrate. However, the present disclosure may not be necessarily limited to this.

Figure 16:
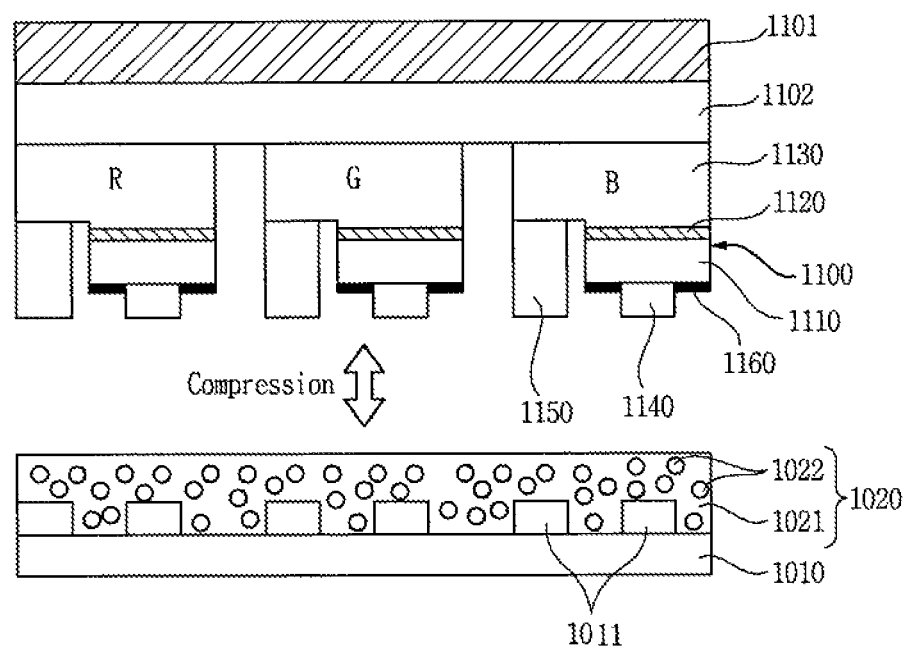

Referring to FIG. 16, the lower substrate 1010 disposed with the line electrode 1011 is provided at an upper portion thereof.

A conductive adhesive layer 1020 having adhesiveness, mobility and viscosity is disposed on the lower substrate 1010.

A set in which the semiconductor light emitting device 1100 and growth substrate 1101 are coupled to each other is prepared such that the first electrode 1140 and second electrode 1150 of the semiconductor light emitting device 1100 are directed toward the lower substrate 1010.

A set with the semiconductor light emitting device 1100 and growth substrate 1101 is aligned with the line electrode 1011, and then heat or catalyst is applied thereto while pressuring the conductive adhesive layer 1020.

The conductive adhesive layer 1020 has mobility due to heat, and the semiconductor light emitting device 1100, first electrode 1140 and second electrode 1150 are surrounded by the body 1021 of the conductive adhesive layer 1020, and the first electrode 1140 and second electrode 1150 are electrically connected to the line electrode 1011 by means of the conductors 1022.

Then, the conductive adhesive layer 1020 is cured during the process of dissipating heat.

Figure 17:
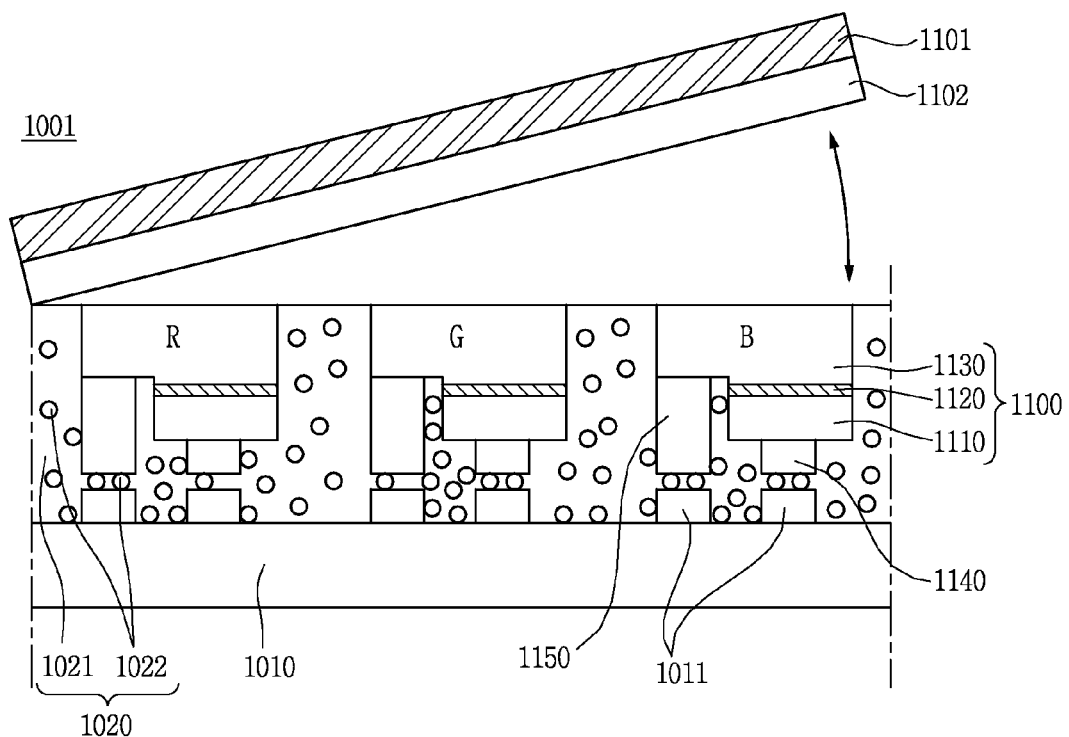

Referring to FIG. 17, when the conductive adhesive layer 1020 is cured, the growth substrate 1101 and buffer layer 1102 are removed. For a method of removing the growth substrate 1101 and buffer layer 1102, wet etching, dry etching or laser lift off (LLO) methods may be used, but the present disclosure may not be necessarily limited to this.

Figure 18:
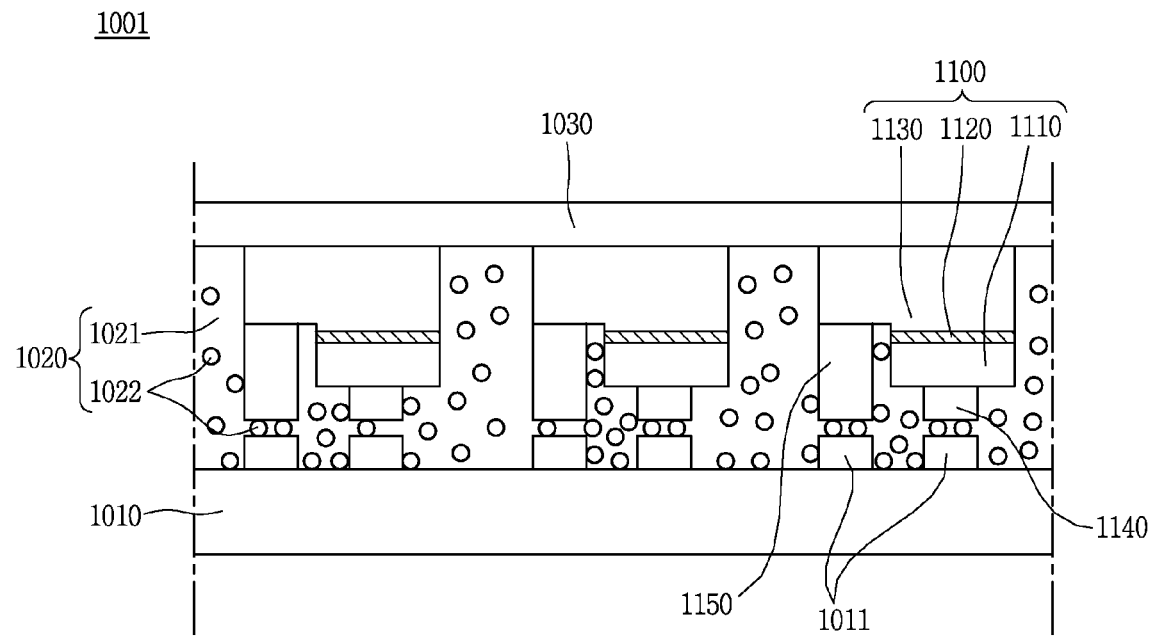

Referring to FIG. 18, a protective substrate 1030 is bonded to a surface from which the growth substrate 1101 and buffer layer 1102 are removed (an upper surface of the second conductive semiconductor layer with reference to FIG. 17).

While the invention has been shown and described with respect to various embodiments of the present invention, it will be of course understood by those skilled in the art that various modifications may be made without departing from the gist of the invention as defined in the following claims, and it is to be noted that those modifications should not be understood individually from the technical concept and prospect of the present invention.

What is claimed is:

1. A display device, comprising:
    a lower substrate;
    a line electrode located at the lower substrate;
    a plurality of semiconductor light emitting devices electrically connected to the line electrode and configured to generate light, the plurality of semiconductor light emitting devices including red, green and blue semiconductor light emitting devices that emit red, green and blue light, respectively, to form one pixel region, the plurality of semiconductor light emitting devices containing inorganic semiconductor materials; and
    a conductive adhesive layer, the conductive adhesive layer comprising:
        a body configured to combine the lower substrate with the semiconductor light emitting devices, and
        conductors dispersed within the body to electrically connect the lower substrate to the semiconductor light emitting devices,
    wherein the semiconductor light emitting devices comprise:
        a first conductive semiconductor layer;
        an active layer located on the first conductive semiconductor layer;
        a second conductive semiconductor layer located on the active layer; and
        a first electrode electrically connected to the first conductive semiconductor layer,
    wherein a reflective layer is located on a lower surface of the first conductive semiconductor layer, and
    wherein the first electrode is disposed at one region of the lower surface, and the reflective layer is disposed at another region of the lower surface.

2. The display device of claim 1, further comprising:
    a second electrode electrically connected to the second conductive semiconductor layer,
    wherein the first electrode is disposed on a lower surface of the first conductive semiconductor layer, and
    wherein the second electrode is disposed on a lower surface of the second conductive semiconductor layer.

3. The display device of claim 2, wherein the body of the conductive adhesive layer surrounds the first electrode and the second electrode.

4. The display device of claim 3, wherein the first electrode and the second electrode are in contact with a portion of the conductors.

5. The display device of claim 1, wherein the reflective layer includes:
    a first layer having a first refractive index, and
    a second layer having a second refractive index which is different from the first refractive index.

6. The display device of claim 1, further comprising an electron blocking layer located between the active layer and the second conductive semiconductor layer, the electron blocking layer having a band gap energy greater than that of the active layer and the second conductive semiconductor layer.

7. The display device of claim 1, wherein the red semiconductor light emitting device has a composition formula of $(Al_xGa_{1-x})_{0.5}In_{0.5}P$.

8. The display device of claim 1, wherein the red semiconductor light emitting device has a composition formula of GaAsP.

9. The display device of claim 1, wherein the green semiconductor light emitting device has a composition formula of GaP.

10. The display device of claim 1, wherein the blue semiconductor light emitting device has a composition formula of $In_xAl_yGa_{1-x-y}N$ ($0 \leq x \leq 1$, $0 \leq y \leq 1$, $0 \leq x+y \leq 1$).

11. The display device of claim 1, wherein the body of the conductive adhesive layer is disposed to surround a lateral surface and a lower surface of the semiconductor light emitting devices.

12. The display device of claim 11, wherein the body of the conductive adhesive layer contains a non-transmitting synthetic resin that absorbs light generated from the semiconductor light emitting devices.

13. The display device of claim 1, wherein the body contains a material having adhesiveness.

14. The display device of claim 1, wherein the body has mobility and is cured in any one of a normal temperature, a high temperature and a catalyst atmosphere.

15. The display device of claim 1, wherein the body contains a material that is black.

16. The display device of claim 1, wherein the line electrode is formed to be protruded in a direction of the semiconductor light emitting devices.

17. A display device, comprising:
   a substrate;
   an electrode located on the substrate;
   a plurality of semiconductor light emitting devices electrically connected to the electrode and configured to generate light, the plurality of semiconductor light emitting devices containing inorganic semiconductor materials; and
   a conductive adhesive layer interposed between the electrode and the substrate, the conductive adhesive layer comprising:
      an adhesive body configured to fix the substrate to the semiconductor light emitting devices, and
      conductors interspersed throughout the adhesive body to electrically connect the electrode to the semiconductor light emitting devices,
   wherein the semiconductor light emitting devices comprise:
      a first conductive semiconductor layer;
      an active layer located on the first conductive semiconductor layer;
      a second conductive semiconductor layer located on the active layer; and
      a first electrode electrically connected to the first conductive semiconductor layer,
   wherein a reflective layer is located on a lower surface of the first conductive semiconductor layer, and
   wherein the first electrode is disposed at one region of the lower surface, and the reflective layer is disposed at another region of the lower surface.

18. The display device of claim 17, wherein the semiconductor light emitting devices face the electrode without touching the electrode, and
   wherein the conductors of the conductive adhesive layer are interposed between the electrode and respective ones of the semiconductor light emitting devices to provide an electrical connection between the electrode and respective ones of the semiconductor light emitting devices.

19. The display device of claim 17, wherein the adhesive body of the conductive adhesive layer is located between adjacent ones of the semiconductor light emitting devices and surrounds lateral surfaces of the semiconductor light emitting devices.

* * * * *